United States Patent
Rawat et al.

(10) Patent No.: US 12,046,324 B2
(45) Date of Patent: Jul. 23, 2024

(54) MODULAR MEMORY ARCHITECTURE WITH GATED SUB-ARRAY OPERATION DEPENDENT ON STORED DATA CONTENT

(71) Applicants: STMicroelectronics International N.V., Geneva (CH); STMicroelectronics (Crolles 2) SAS, Crolles (FR)

(72) Inventors: Harsh Rawat, Faridabad (IN); Praveen Kumar Verma, Greater Noida (IN); Promod Kumar, Greater Noida (IN); Christophe Lecocq, Varces (FR)

(73) Assignees: STMicroelectronics International N.V., Geneva (CH); STMicroelectronics (Crolles 2) SAS, Crolles (FR)

( * ) Notice: Subject to any disclaimer, the term of this patent is extended or adjusted under 35 U.S.C. 154(b) by 106 days.

(21) Appl. No.: 17/861,458

(22) Filed: Jul. 11, 2022

(65) Prior Publication Data
US 2023/0051672 A1    Feb. 16, 2023

Related U.S. Application Data

(60) Provisional application No. 63/231,856, filed on Aug. 11, 2021.

(51) Int. Cl.
*G11C 7/00* (2006.01)
*G11C 7/10* (2006.01)
(Continued)

(52) U.S. Cl.
CPC .............. *G11C 8/10* (2013.01); *G11C 7/1087* (2013.01); *G11C 7/222* (2013.01); *G11C 8/08* (2013.01)

(58) Field of Classification Search
CPC ......... G11C 8/10; G11C 7/1087; G11C 7/222; G11C 8/08; G11C 5/005; G11C 11/418; G11C 7/1006; G11C 11/419
See application file for complete search history.

(56) References Cited

U.S. PATENT DOCUMENTS 5,367,653 A    11/1994   Coyle et al.
5,752,260 A    5/1998    Liu
(Continued)

OTHER PUBLICATIONS

Selvan, Vinoth: "Adaptive Cache Power Management Strategies", a Thesis Submitted to the Faculty of the Graduate School of the University of Minnesota, Jun. 2016, 51 pages.

*Primary Examiner* — Hien N Nguyen
(74) *Attorney, Agent, or Firm* — Crowe & Dunlevy LLC

(57) ABSTRACT

A memory circuit includes an array of memory cells arranged with first word lines connected to a first sub-array storing less significant bits of data and second word lines connected to a second sub-array storing more significant bits of data. A row decoder circuit coupled to the first and second word lines generates word line signals. A word line gating circuit is configured to selectively gate passage of the word line signals to the second word lines for the second sub-array in response to assertion of a maximum value signal. A data modification circuit performs a mathematical operation on data read from the array of memory cells, and asserts the maximum value signal if the mathematical operation performed on the less significant bits of data from the first sub-array produces a maximum data value.

38 Claims, 13 Drawing Sheets

(51) Int. Cl.
  *G11C 7/22*    (2006.01)
  *G11C 8/08*    (2006.01)
  *G11C 8/10*    (2006.01)
  *G11C 11/00*   (2006.01)

(56) References Cited

U.S. PATENT DOCUMENTS

| | | |
|---|---|---|
| 6,112,295 A | 8/2000 | Bhamidipati et al. |
| 6,608,772 B2 | 8/2003 | Ooishi |
| 6,707,752 B2 | 3/2004 | Zhang |
| 6,751,143 B2 | 6/2004 | Morgan et al. |
| 6,751,159 B2 | 6/2004 | Farrell et al. |
| 7,038,949 B2 | 5/2006 | Chae et al. |
| 7,088,638 B1 | 8/2006 | Bunce et al. |
| 7,251,186 B1 | 7/2007 | Kengeri et al. |
| 7,339,850 B2 | 3/2008 | Morishima |
| 7,420,867 B2 | 9/2008 | Brox |
| 7,469,369 B2 | 12/2008 | Matsuoka et al. |
| 7,684,257 B1 | 3/2010 | Lee et al. |
| 7,848,129 B1 | 12/2010 | Deshpande et al. |
| 8,000,156 B2 | 8/2011 | Van Winkelhoff et al. |
| 8,850,137 B2 | 9/2014 | Nazar et al. |
| 8,902,672 B2 | 12/2014 | Iyer et al. |
| 9,361,955 B2 | 6/2016 | Muralimanohar et al. |
| 9,411,391 B2 | 8/2016 | Bhatia et al. |
| 9,460,016 B2 | 10/2016 | Redford et al. |
| 9,971,541 B2 | 5/2018 | Lea et al. |
| 10,048,888 B2 | 8/2018 | Willcock et al. |
| 10,268,389 B2 | 4/2019 | Lea |
| 10,402,110 B2 | 9/2019 | Ware et al. |
| 10,460,781 B2 | 10/2019 | Berger et al. |
| 10,522,210 B2 | 12/2019 | Hush et al. |
| 10,740,188 B2 | 8/2020 | Park |
| 10,867,681 B2 | 12/2020 | Clinton et al. |
| 10,991,423 B2 | 4/2021 | Singh et al. |
| 11,705,176 B2 | 7/2023 | Endoh et al. |
| 2001/0024382 A1* | 9/2001 | Shimoyama ............. G11C 8/18 365/189.12 |
| 2008/0183984 A1 | 7/2008 | Beucler et al. |
| 2013/0308364 A1 | 11/2013 | Smith |
| 2015/0109865 A1 | 4/2015 | Gulati et al. |
| 2016/0329088 A1* | 11/2016 | You ..................... G11C 11/4085 |
| 2018/0046436 A1* | 2/2018 | Lu ......................... G11C 11/419 |
| 2020/0143901 A1 | 5/2020 | Chhabra et al. |
| 2020/0258890 A1 | 8/2020 | Augustine et al. |
| 2021/0117156 A1 | 4/2021 | Ali et al. |
| 2021/0142863 A1 | 5/2021 | Nazar et al. |
| 2021/0391001 A1* | 12/2021 | Park ..................... G11C 7/1006 |
| 2023/0050783 A1 | 2/2023 | Verma et al. |
| 2023/0051672 A1 | 2/2023 | Rawat et al. |
| 2023/0135708 A1* | 5/2023 | Verma .................. G06F 3/0629 711/154 |
| 2023/0393766 A1* | 12/2023 | Bedeschi ............... H10B 63/30 |

\* cited by examiner

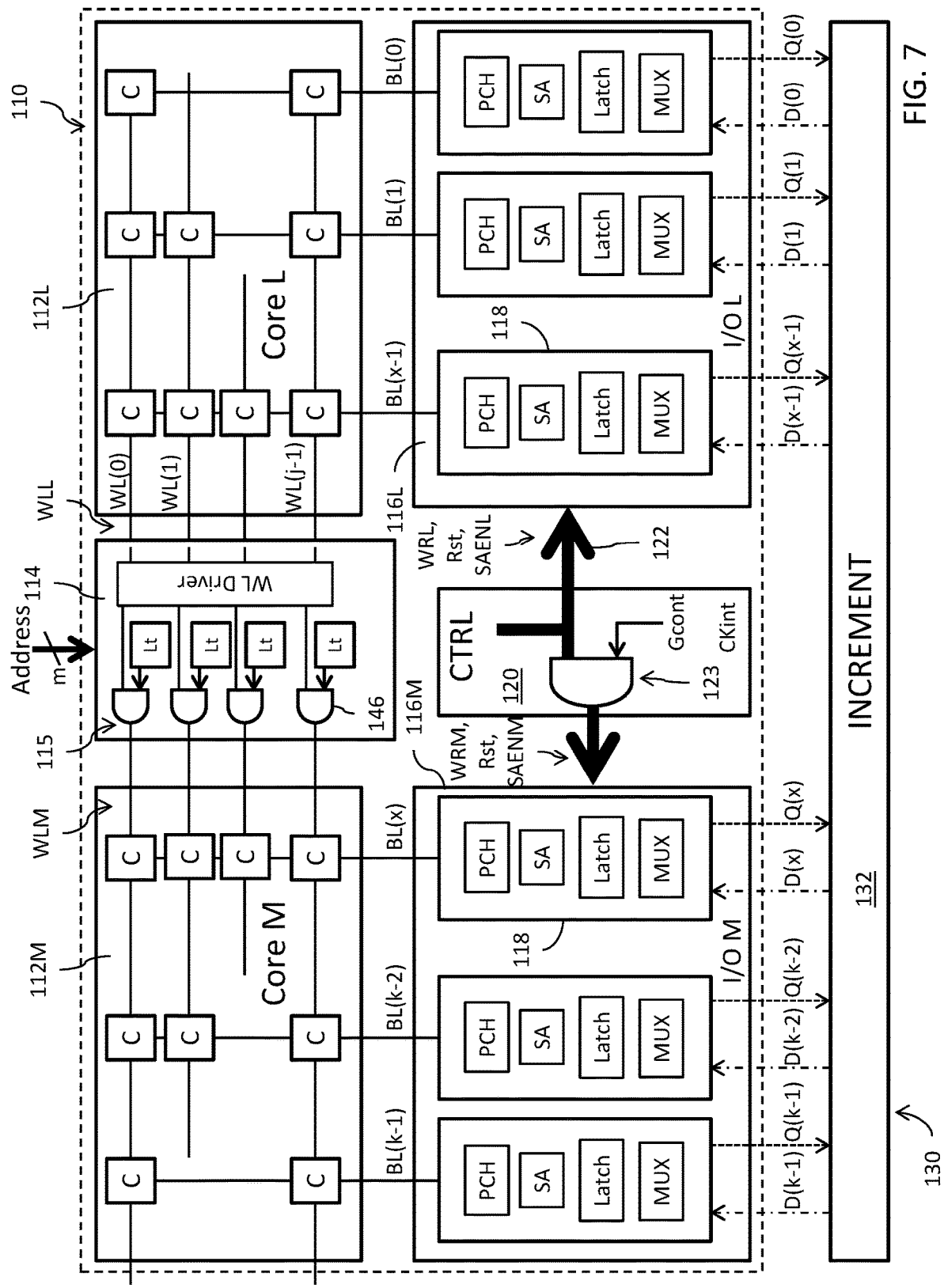

ML MEMORY ARCHITECTURE
WITH GATED SUB-ARRAY OPERATION
DEPENDENT ON STORED DATA CONTENT

CROSS REFERENCE TO RELATED
APPLICATIONS

This application claims priority from United States Application for Patent No. 63/231,856, filed Aug. 11, 2021, the disclosure of which is incorporated by reference.

TECHNICAL FIELD

The present invention generally relates to a static random access memory (SRAM) circuit and, in particular, to a modular memory architecture for the SRAM circuit where sub-arrays of the memory are gated for operation dependent on the data content stored in the memory.

BACKGROUND

Reference is made to FIG. 1 which shows a block diagram of a static random access memory (SRAM) 10. The memory 10 includes a memory core 12 formed by a plurality of SRAM cells (C) (for example, of the 6T or 8T type as is well known in the art). The cells C are arranged in an array including j rows and k columns. The cells C in each row of the memory core 12 are coupled to a corresponding word line (WL), and the cells in each column are coupled to at least one corresponding bit line (BL). In an implementation using the 6T type SRAM circuit, a pair of complementary bit lines is present and is used in connection with both writing data to and reading data from the memory cell of a column. In an implementation using the 8T type SRAM circuit, a pair of complementary write bit lines and a single read bit line are present, with the write bit lines used in connection with writing data to the memory cell and the read bit line used in connection with reading data from the memory cell.

The memory 10 further includes a row decoder circuit 14 that is configured to receive a memory address (Address). The row decoder circuit 14 decodes the received memory address and selectively actuates one word line (WL) which corresponds to the decoded memory address in the memory core 12. Details of the circuitry for the row decoder circuit 14 are not provided as such circuitry is well known to those skilled in the art.

Data input/output (I/O) circuitry 16 for the memory 10 includes an I/O circuit 18 for each column of the memory core 12. Each I/O circuit 18 includes a precharge circuit PCH and a sense amplifier circuit SA connected to the bitline BL of the corresponding column. The precharge circuits PCH are used to precharge the bit lines BL to a certain voltage level (for example, Vdd) prior to a read or write operation. The sense amplifier circuit SA functions, when actuated by assertion of a sense amplifier enable (SAEN) signal during the read operation, to drive an amplifier output signal to a supply rail (Vdd or ground, for example) as a function of the logic state of the data bit stored in the memory cell C of the row which is selected by the actuation of the word line WL. The logic state of the data bit output by the sense amplifier circuit SA is latched by a bit latch (Latch) circuit. In connection with the data read operation, the output from each Latch circuit coupled through multiplexing circuitry MUX to a data output line Q(0), ..., Q(k−1) for a corresponding bit of the data output port. In connection with a data write operation for the SRAM 12, the multiplexing circuitry MUX couples a data input line D(0), ..., D(k−1) for a corresponding bit of the data input port to the bit lines BL to write data into the memory cells C.

A control (CTRL) circuit 20 for the memory 10 generates a set of control signals 22 that are applied to the I/O circuitry 16 to control its operation. The control signals 22 include, for example, a precharge control signal for the precharge circuits PCH, a multiplexer control signal for the multiplexing circuitry MUX, and a sense amplifier enable (SAEN) signal for the sense amplifier circuits SA. Details of the circuitry for the control circuit 20 are not provided as such circuitry is well known to those skilled in the art.

Reference is further made to FIG. 2 which shows a block diagram of a circuit 30 including an SRAM 10 (FIG. 1) that is configured to store data. In a particular application, the stored data is histogram data where each data word location (dw loc) in the memory core 12 of the memory 10 stores a count value (Count). For the memory 10 of FIG. 1, for example, the k memory cells C of each row at a given memory address location form a bin which stores a data word corresponding to the count value (Count) of the histogram. The bit stored in the memory cell C of column 0 is the least significant bit (LSB) of the count value and the bit stored in the memory cell C of column k−1 is the most significant bit (MSB) of the count value. As part of the operation of the circuit 30 for building a histogram, the count value is modified in some way (for example, incremented by one) each time the data word location is accessed. This operation typically involves three steps: step 1) reading the k-bit current count value from a particular data word location accessed in response to an m-bit memory address (Address); step 2) mathematically modifying the current count value (for example, incrementing (by one, for example)); and step 3) writing the modified count value back to the SRAM 12 at the accessed data word location. The step 2) operation for mathematically modifying the count value is performed here by a data modification circuit 32 that is external to (and separate from) the memory 10. The data modification circuit 32 is coupled to the data output (Q) port and data input (D) port of the memory 10 through one or more n-bit data bus circuits. As an example, the data modification circuit 32 may comprise an n-bit adder circuit that operates on the current count value read from the memory at the data output (Q) to increment by one and output the modified count value to be written back to the memory at the data input (D).

Reference is now made to FIG. 3 which shows a timing diagram for the operation of the circuit 30. At time t1, the chip select signal (CSN) is asserted logic low to select the SRAM 10 and the write enable signal (WEN) is deasserted logic high to place the SRAM 10 in data read mode. At time t2, the memory address (Address) is applied and the clock signal CLK pulses a first time to initiate a read operation. The Address is decoded by the SRAM 10 and the word line (WL) coupled to the data word location (dw loc) corresponding to the decoded Address is asserted logic high at time t3. The count value (Count) is then read (step 1) from the addressed data word location in the memory core 12 and output at time t4 through the data output (Q) port of the SRAM 10. The chip select signal (CSN) is then deasserted logic high at time t5 to deselect the SRAM 10 so that the SRAM 10 does not perform an operation in response to the next pulse of the clock signal CLK. At time t6, the clock signal CLK pulses a second time to cause the data modification circuit 32 to perform the mathematical modify operation (step 2) at time t7, which in this example case is an increment by one (+1) operation. The modified count value (Count+1) is then applied by the data modification circuit 32 to the data input (D) port of the SRAM 10 at time t8. At time t9, the write enable signal (WEN) is asserted logic low to place the SRAM 10 in write mode. The chip select signal (CSN) is then asserted logic low at time t10 to select the SRAM 10. At time t11, the memory address (Address) is applied (e.g., remains applied from the read) and the clock signal CLK pulses a third time to initiate a data write operation. The Address is decoded by the SRAM 10 and the word line (WL) coupled to the data word location (dw loc) is asserted logic high at time t12. The modified count value (Count+1) is then written (step 3) from the data input port of the SRAM 10 at time t13 to the addressed data word location.

There are a number of concerns with the circuit 30 of FIG. 2 and its operation as detailed in FIG. 3. The circuit operation is multi-cycle in that it requires three clock cycles and two separate word line assertions to complete. Because of this multi-cycle operation, there is significantly high power consumption in the circuit 30 (particularly within the memory 10) due to data signal toggling. The power consumption concern is further magnified by the fact that the mathematical modify part of the operation (step 2) occurs external to the SRAM 10 thus there is a required toggling of data for the data signals at both the data output (Q) port and data input (D) port.

There is accordingly a need in the art to address the power consumption concerns and provide a more efficient implementation of the read-modify-write operation.

SUMMARY

In an embodiment, a circuit comprises a memory circuit including: a memory core formed by an array of memory cells storing data words at rows, wherein each row is connected to a word line, and wherein said array is arranged to include a first sub-array storing less significant bits of said data words and a second sub-array storing more significant bits of said data words; and a row decoder circuit configured to receive an address, decode the received address and generate a word line signal that is applied to a selected one of the word lines for a certain data location based on the decoded address. The circuit further comprises a data modification circuit configured to perform a mathematical operation on a data word read from said certain data location in the array of memory cells corresponding to the selected one of the word lines in order to produce a modified data word that is written back to that certain data location in the array of memory cells. The row decoder further includes a word line gating circuit configured to selectively gate passage of the word line signal to memory cells of the second sub-array in response to assertion of a maximum value signal. A detection circuit is configured to assert said maximum value signal in response to a determination that the mathematical operation performed on the less significant bits of said data word from the first sub-array produces a maximum data value for the less significant bits of said data word.

In an embodiment, a circuit comprises a memory circuit including: an array of memory cells arranged to include a first sub-array storing less significant bits of data and a second sub-array storing more significant bits of data; a first plurality of word lines for the first sub-array; a second plurality of word lines for the first sub-array; and a row decoder circuit coupled to the first and second pluralities of word lines, wherein said row decoder generates word line signals and includes a word line gating circuit configured to selectively gate passage of said word line signals to the second plurality of word lines for the second sub-array in response to assertion of a maximum value signal. A data modification circuit is configured to perform a mathematical operation on data read from the array of memory cells. A detection circuit is configured to assert said maximum value signal in response to the mathematical operation performed on the less significant bits of data from the first sub-array producing a maximum data value.

An embodiment further concerns a method for operating a memory circuit that includes an array of memory cells arranged in a modular architecture with a first sub-array configured to store less significant bits of data and a second sub-array configured to store more significant bits of data. The method comprises: reading data from the memory circuit; performing a mathematical operation on data read from the memory circuit to generate modified data; and writing the modified data back to the memory circuit; wherein reading data and writing modified data comprises asserting a word line signal to select a data location in the memory for reading data and writing modified data. The method further comprises: blocking application of the word line signal to the second sub-array; wherein performing the mathematical operation comprises performing the mathematical operation on the less significant bits of the data read from said data location; asserting a maximum value signal if the performed mathematical operation on the read less significant bits of the data produces a maximum data value; and thereafter permitting application of the word line signal to the second sub-array for at least said data location in response the asserted maximum value signal.

BRIEF DESCRIPTION OF THE DRAWINGS

For a better understanding of the embodiments, reference will now be made by way of example only to the accompanying figures in which:

FIGS. 4, 7, 10 and 11 each show a block diagram of a circuit configured to perform a read-modify-write operation using an SRAM circuit with a modular memory architecture including sub-arrays that are gated for operation dependent on the data content stored in the memory;

DETAILED DESCRIPTION

Figure 1:
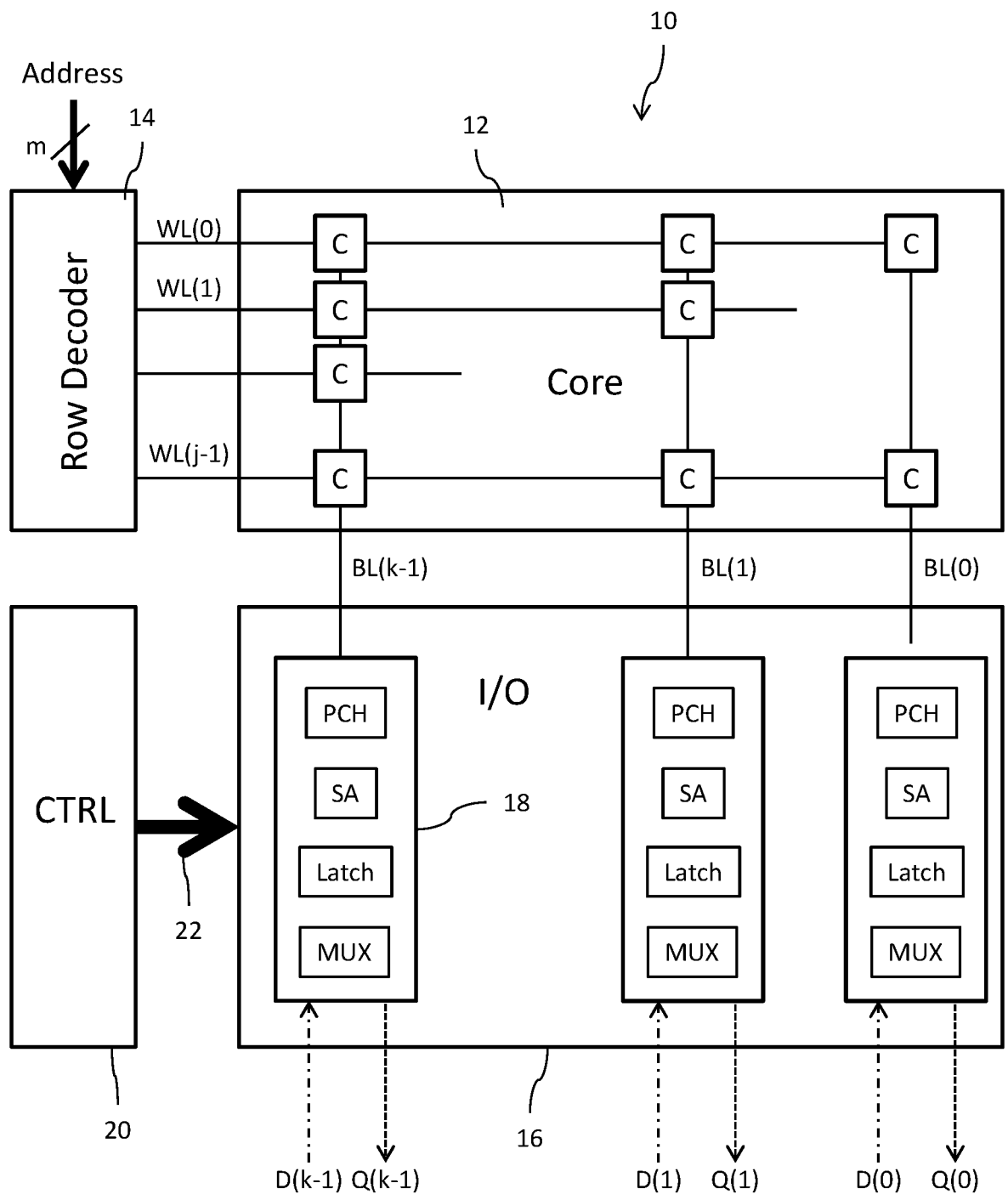
FIG. 1 shows a block diagram of a static random access memory (SRAM) circuit.
Figure 2:
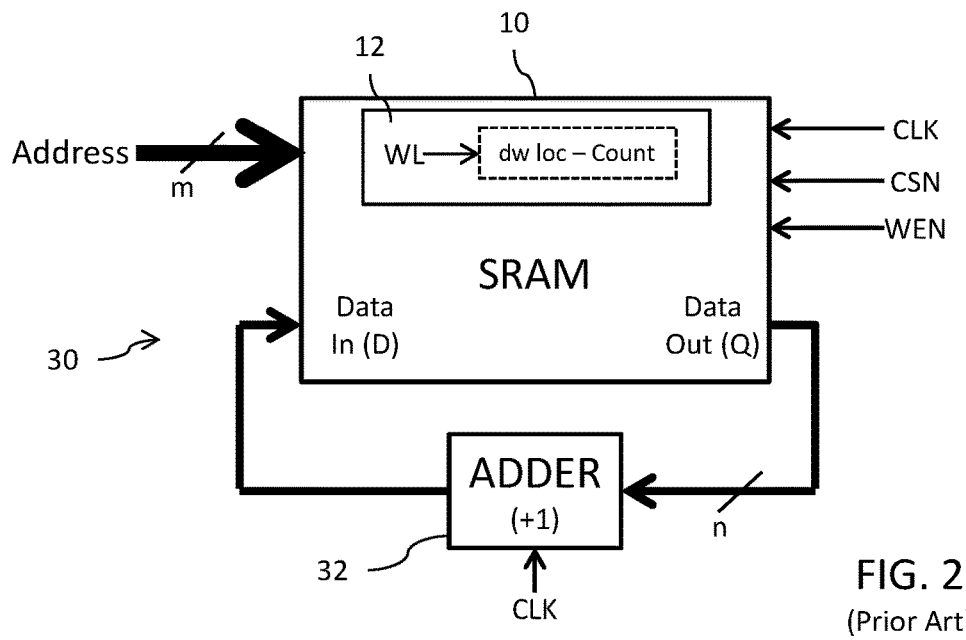
FIG. 2 shows a block diagram of a circuit configured to perform a read-modify-write operation with respect to a count value stored in the SRAM using an external modify circuit.
Figure 3:
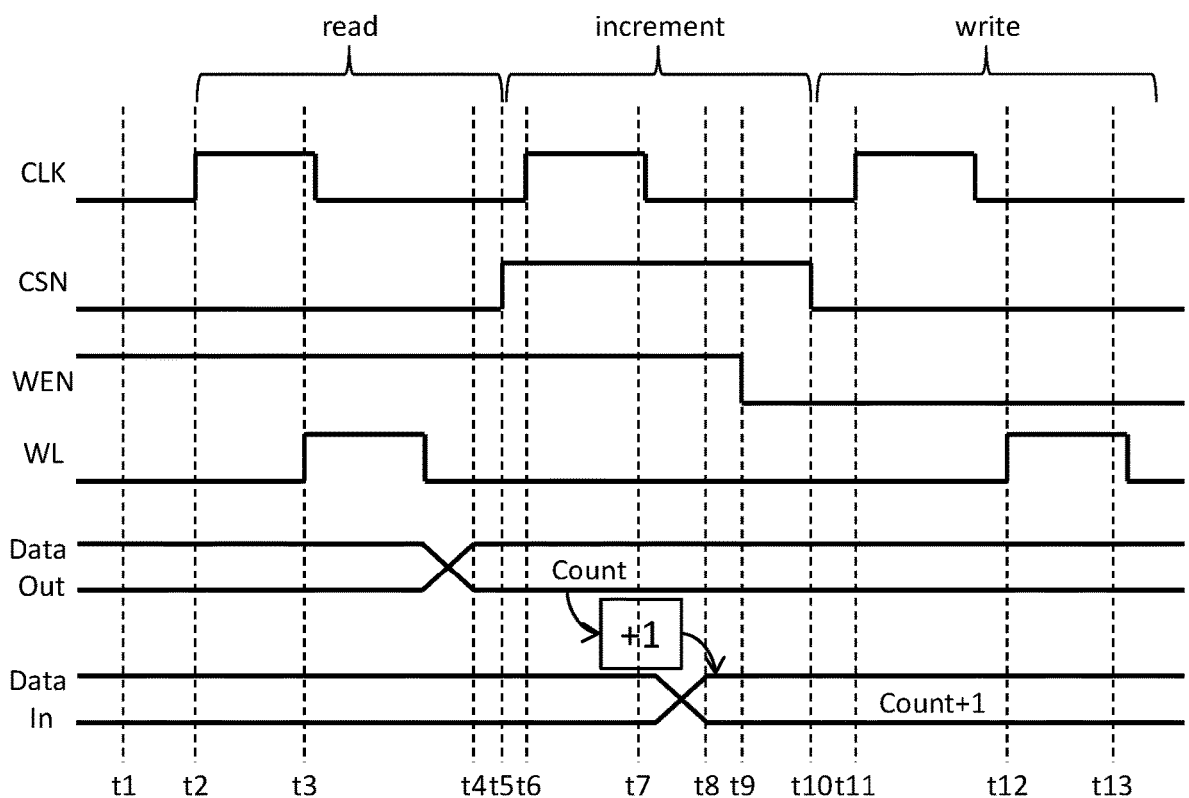
FIG. 3 shows a timing diagram for operation of the circuit of FIG. 2.
Figure 4:
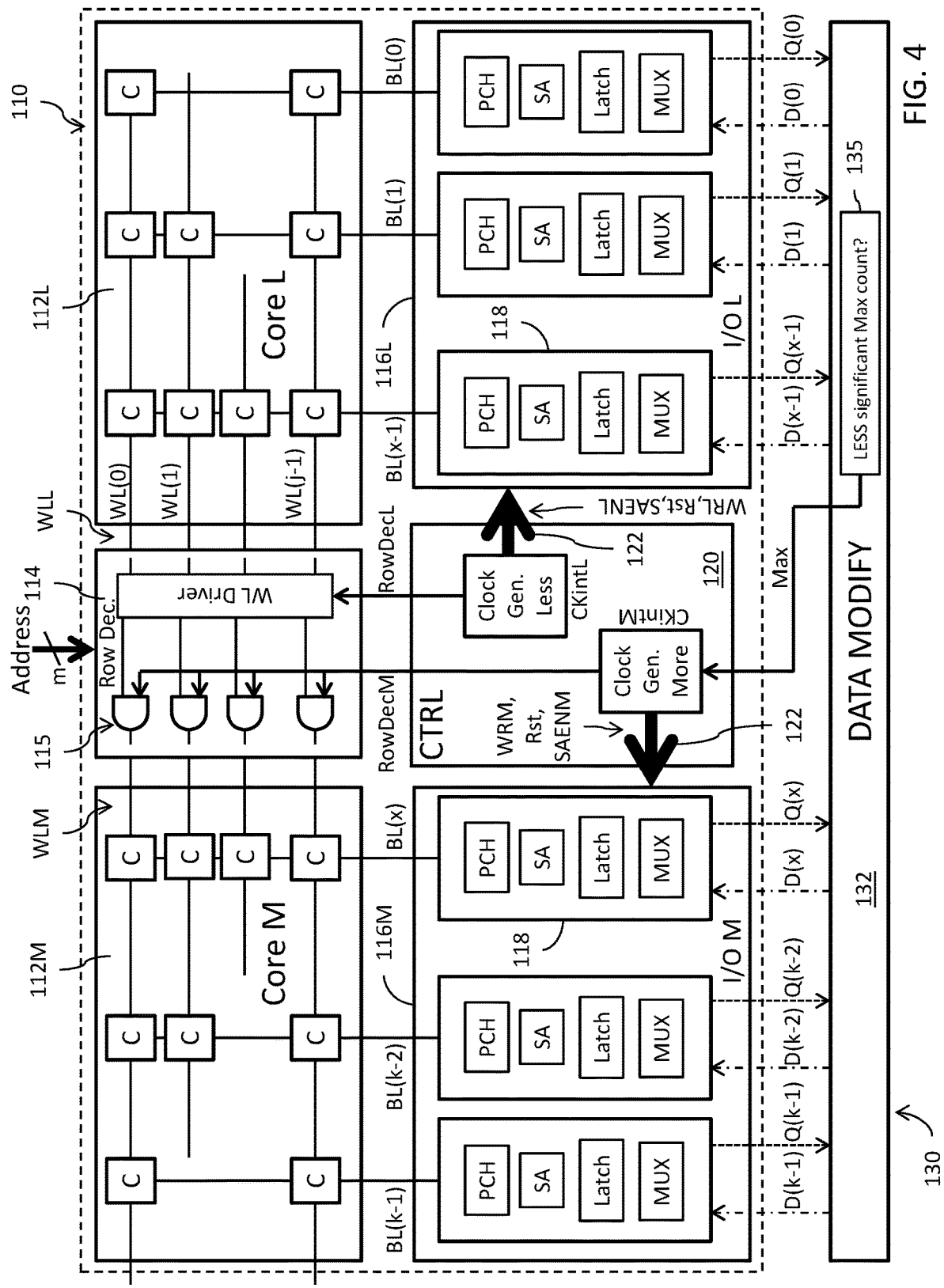

Reference is made to FIG. 4 which shows a block diagram of a circuit 130 including an SRAM 110 that is configured to store data. The memory 110 includes a memory core 112 formed by a plurality of SRAM cells (C) (for example, of the 6T or 8T type as is well known in the art). The overall array for the core 112 is arranged to include j rows and k columns, and this overall array is divided into a modular architecture with a first sub-array 112L including j rows and x columns and a second sub-array 112M including j rows and k-x columns. The division of columns between the first and second sub-arrays 112L and 112M need not be equal. Furthermore, the illustration of two sub-arrays is by example only, it being understood that the invention described herein can be applied to a memory core 112 including three or more sub-arrays.

In a particular application, the data stored in the memory 110 is histogram data where each data word location in the memory core 112 stores a count value (Count). For the memory 110 of FIG. 4, for example, the k memory cells C of each row at a given memory address location form a bin which stores a data word corresponding to the count value (Count) of the histogram. The bit stored in the memory cell of column 0 is the least significant bit (LSB) of the count value and the bit stored in the memory cell of column k−1 is the most significant bit (MSB) of the count value. Thus, it will be understood that the first sub-array 112L, which includes memory cells C storing bits 0 to x−1 of the count values, forms a LESS significant sub-array of the core 112 (where the "L" designator is for indicating a component part of the memory 110 associated with the LESS significant bits of the count value). The second sub-array 112M, which includes memory cells C storing bits x to k−1 of the count values, forms a MORE significant sub-array of the core 112 (where the "M" designator is for indicating a component part of the memory 110 associated with the MORE significant bits of the count value).

The cells C in each row of the memory core 12 are coupled to a corresponding word line (WL), and the cells in each column are coupled to at least one corresponding bit line (BL). In an implementation using the 6T type SRAM circuit, a pair of complementary bit lines is present and is used in connection with both writing data to and reading data from the memory cell of a column. In an implementation using the 8T type SRAM circuit, a pair of complementary write bit lines and a single read bit line are present, with the write bit lines used in connection with writing data to the memory cell and the read bit line used in connection with reading data from the memory cell.

The memory 110 further includes a row decoder circuit 114 that is configured to receive a memory address (Address). The row decoder circuit 114 decodes the received memory address and selectively actuates one word line (WL) which corresponds to the decoded memory address in the memory core 112. Details of the circuitry for the row decoder circuit 114 are not provided as such circuitry is well known to those skilled in the art. The row decoder includes a word line (WL) driver circuit that is enabled for operation in response to assertion of a first row decoder control signal (RowDecL).

In view of the modular architecture where the core 112 is divided into a first sub-array 112L and a second sub-array 112M, the row decoder circuit 114 further includes a word line signal gating circuit 115 that operates to selectively pass (or gate) the word line signals generated by the WL driver circuit to the word lines WL connected to the memory cells C in the second sub-array 112M. The word line signal gating circuit 115 may, for example, comprise a logic circuit (formed using logical AND gating) that logically combines the word line signals and a second row decoder control signal (RowDecM). The output of the word line signal gating circuit 115 is coupled to the word lines for the second sub-array 112M. When the second row decoder control signal (RowDecM) is deasserted, the logic circuit of the word line signal gating circuit 115 blocks the word line signals generated by the WL driver circuit from being applied to the word lines for the memory cells C in the second sub-array 112M, and in this configuration it is only the word line signals from the WL driver circuit that are applied by the row decoder 114 to the memory cells C in the first sub-array 112L. Conversely, when the second row decoder control signal (RowDecM) is asserted, the logic circuit of the word line signal gating circuit 115 passes the word line signals to the word lines for the memory cells C in the second sub-array 112M, and in this configuration the word line signals are applied by the row decoder 114 to the memory cells C in both the first and second sub-arrays 112L, 112M.

Data input/output (I/O) circuitry 116 for the memory 10 includes an I/O circuit 118 for each column of the memory core 112. The I/O circuitry 116 is divided in accordance with the modular architecture of the memory core 12 into first I/O circuitry (I/O L) 116L connected to the bit lines of the first sub-array 112L for the LESS significant bits and second I/O circuitry (I/O M) 116M connected to the bit lines of the second sub-array 112M for the MORE significant bits. Each I/O circuit 118 includes a precharge circuit PCH and a sense amplifier circuit SA connected to the bitline BL of the corresponding column. The precharge circuits PCH are used to precharge the bit lines BL to a certain voltage level (for example, Vdd) prior to a read or write operation. The sense amplifier circuit SA functions, when actuated by assertion of a sense amplifier enable (SAEN) signal during the read operation, to drive an amplifier output signal to a supply rail (Vdd or ground, for example) as a function of the logic state of the data bit stored in the memory cell C of the row which is selected by the actuation of the word line WL. The logic state of the data bit output by the sense amplifier SA circuit is latched by a bit latch (Latch) circuit. In connection with the data read operation, the output from each Latch circuit is coupled through multiplexing circuitry MUX to a data output line Q(0), . . . , Q(k−1) for a corresponding bit of the data output port. In connection with a data write operation for the SRAM 112, the multiplexing circuitry MUX couples a data input line D(0), . . . , D(k−1) for a corresponding bit of the data input port to the bit lines BL to write data into the memory cells C.

A control (CTRL) circuit 120 for the memory 110 generates a set of control signals 122 that are applied to the I/O circuitry 116 to control its operation. The control signals 122 include, for example, a precharge control signal for the precharge circuits PCH, a multiplexer control signal for the multiplexing circuitry MUX, and a sense amplifier enable signal for the sense amplifier circuits SA. Details of the circuitry for the control circuit 120 are not provided as such circuitry is well known to those skilled in the art.

With the modular architecture where the core 112 is divided into the first and second sub-arrays 112L and 112M and the I/O circuitry 116 is divided into first and second I/O circuitry 116L and 116M, respectively, the control circuit 120 further includes a first clock generator circuit (Clock Gen. Less) which generates the control signals 122 for application to the first I/O circuitry (I/O L) 116L for the LESS significant bits and a second clock generator circuit (Clock Gen. More) which generates the control signals 122 for application to the second I/O circuitry (I/O L) 116M for the MORE significant bits. The first clock generator circuit (Clock Gen. Less) further generates the first row decoder control signal (RowDecL) which enables operation of the WL driver circuit. The second clock generator circuit (Clock Gen. More) receives a gating control signal (Max) and outputs the second row decoder control signal (RowDecM) for controlling operation of the word line signal gating circuit 115.

The second clock generator circuit (Clock Gen. More) operates to selectively pass (or gate) the control signals 122 to the precharge circuit PCH, the multiplexing circuitry MUX, and the sense amplifier circuit SA of the I/O circuits 118 in the second I/O circuitry 112M in response to the gating control signal (Max). Additionally, the second clock generator circuit (Clock Gen. More) asserts the second row decoder control signal (RowDecM) in response to the gating control signal (Max). The second clock generator circuit (Clock Gen. More) may, for example, include a logic circuit (formed using logical AND gating) that logically combines the various control signals 122 and the gating control signal (Max). When the gating control signal (Max) is deasserted, the logic circuit of the second clock generator circuit (Clock Gen. More) blocks the control signals 122 from being applied to the precharge circuit PCH, the multiplexing circuitry MUX, and the sense amplifier circuit SA of the I/O circuits 118 in the second I/O circuitry 112M, and in this configuration the control signals are only applied by the control circuit 120 to only the first I/O circuitry 112L. Additionally, the second row decoder control signal (RowDecM) is deasserted by the second clock generator circuit (Clock Gen. More), and the word line signal gating circuit 115 responds by blocking the word line signal from being applied to the word lines in the second sub-array 112M. Conversely, when the gating control signal (Max) is asserted, the logic circuit of the second clock generator circuit (Clock Gen. More) passes the control signals 122 to the precharge circuit PCH, the multiplexing circuitry MUX, and the sense amplifier circuit SA of the I/O circuits 118 in the second I/O circuitry 112M, and in this configuration the control signals are applied by the control circuit 120 to both the first and second I/O circuitry 112L and 112M. Additionally, the second row decoder control signal (RowDecM) is asserted by the second clock generator circuit (Clock Gen. More), and the word line signal gating circuit 115 responds by passing the word line signal to the word lines in the second sub-array 112M.

As previously noted, the SRAM 110 stores data in the form of histogram data with a count value (Count). As part of the operation of the circuit 130 for building a histogram, the count value is modified in some way (for example, incremented by one) each time the data word location is accessed. This operation typically involves three steps: step 1) reading the n-bit current count value from a particular data word location accessed in response to an m-bit memory address (Address); step 2) mathematically modifying the current count value (for example, incrementing (by one, for example), decrement, multiply); and step 3) writing the modified count value back to the SRAM core 112 at the accessed data word location. The step 2) operation for mathematically modifying the count value is performed here by a data modification circuit 132 that is external to (and separate from) the memory 110. The data modification circuit 132 is coupled to the data output (Q) port and data input (D) port of the memory 110. As an example, the data modification circuit 132 may comprise an n-bit adder circuit that operates on the current count value read from the memory at the data output (Q) to increment by one and output the modified count value to be written back to the memory at the data input (D).

The data modification circuit 132 includes a maximum count detection (or testing) circuit 135 that is configured to determine whether the data modification operation performed by the data modification circuit 132 on the LESS significant bits 0 to x−1 produces a maximum count value. The assertion of the gating control signal (Max) is dependent on that determination. Specifically, the gating control signal (Max) is deasserted for so long as the data modification operation generates an output for the LESS significant bits 0 to x−1 which is not at a maximum count value. As an example, consider a data modification operation of increment by one where the LESS significant data bits (0 to x−1) received from the data output (Q) are <0,1,1,1> (for x=4) and the result of the increment by one operation produces LESS significant data bits (0 to x−1) for application at the data input (D) of <1,0,0,0>. In this case, the count value of <1,0,0,0> is not the maximum possible count value for the LESS significant data bits (0 to x−1) and the gating control signal (Max) is deasserted by the maximum count detection circuit 135. Conversely, consider the same data modification operation of increment by one where the LESS significant data bits (0 to x−1) received from the data output (Q) are <1,1,1,0> and the result of the increment by one operation produces LESS significant data bits (0 to x−1) for application at the data input (D) of <1,1,1,1>. In this case, increment by one operation produces a maximum possible count value of <1,1,1,1> and in response thereto the gating control signal (Max) is asserted by the maximum count detection circuit 135.

Figure 5:
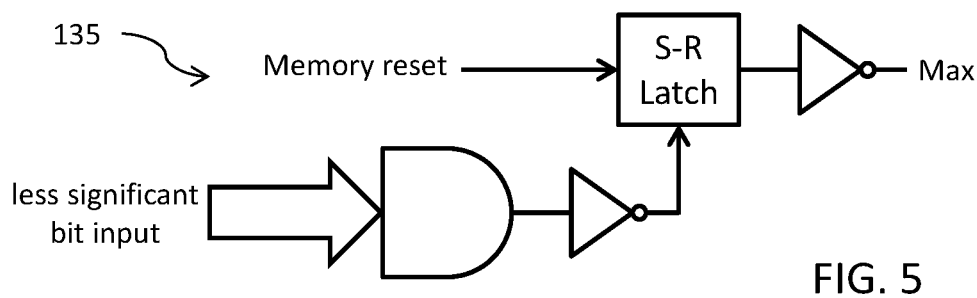
FIG. 5 is a circuit diagram for an example embodiment of a carry detection circuit used in the circuit of FIG. 4.

Reference is now made to FIG. 5 which shows a circuit diagram for an example embodiment of the maximum count detection circuit 135. The maximum count detection circuit 135 includes a set-reset (S-R) latch with an active low control configuration. The set input of the S-R latch is configured to receive a memory reset signal. When the memory reset signal is asserted (logic low) in connection with resetting all the count values to zero, the latch output is set to logic high. A logic inverter circuit inverts the latch output to generate a logic low deassertion of the memory gating control signal (Max). The reset input of the S-R latch is configured to receive an output from a detection logic circuit that includes a logic AND gate configured to logically-AND all the LESS significant data bits (0 to x−1) for a given count value. When all of the LESS significant data bits are logic high, indicating that a maximum count value has been reached, the output of the logic AND gate is also logic high and a logic inverter circuit inverts this output to generate a logic low assertion at the reset input. In response thereto, the latch output is changed (reset) to logic low. The logic inverter circuit then inverts the latch output to generate a logic high assertion of the memory gating control signal (Max).

Overall operation of the circuit 130 will be better understood by consideration of the following. An initialization of the memory 110 is performed to reset all count values and the gating control signal (Max) is deasserted. With the gating control signal (Max) deasserted, the word line signal gating circuit 115 blocks word line signals from being applied to the word lines WL connected to the memory cells C in the second sub-array 112M and the logic circuit of control circuit CTRL blocks control signals 122 from being applied to the precharge circuit PCH, the multiplexing circuitry MUX, and the sense amplifier circuit SA of the I/O circuits 118 in the second I/O circuitry 112M. In this operating configuration for the memory 110, the second sub-array 112M and the second I/O circuitry 112M are effectively disabled in support of a lower power consumption mode of operation. Counting, data modification and histogram generation is performed solely with respect to the first sub-array 112L and the first I/O circuitry 112L for the LESS significant bits (0 to x−1). In response to a received memory address (Address), the row decoder 114 performs a decoding operation and selects one word line WL to be asserted. The count value (Count) in the LESS significant bits (0 to x−1) is then read from the addressed data word location in the memory core 112 and output through the data output (Q) port of the SRAM 110. The data modification circuit 132 then performs the mathematical modify operation, which in this example case is an increment by one (+1) operation, and the modified count value (Count+1) is applied to the data input (D) port of the SRAM 110 to be written back to the addressed data word location. The foregoing process is repeated over and over again for each applied memory address (Address) to build the histogram with incremented count values and the gating control signal (Max) remains deasserted as long as no maximum count value is reaching during the data modification operations.

However, the operating configuration of the memory 110 changes in response to the instance where the mathematical modify operation generates a maximum count value for the LESS significant bits (0 to x−1). Let's assume as an example that the LESS significant bits (0 to x−1) at a certain data word location in the memory 110 currently store a count value of <1,1,1,0>. In response to a received memory address (Address) for that certain data word location, the row decoder 114 performs a decoding operation and selects the corresponding word line WL to be asserted. The count value (Count) of <1,1,1,0> in the LESS significant bits (0 to x−1) is then read from the addressed data word location in the memory core 112 and output through the data output (Q) port of the SRAM 110. The data modification circuit 132 then performs the mathematical modify operation, which in this example case is an increment by one (+1) operation, and the modified count value (Count+1) of <1,1,1,1> is generated. This maximum count value for the LESS significant bits (0 to x−1) is detected by the maximum count detection circuit 135 and in response thereto the gating control signal (Max) is asserted. The operating configuration for the memory 110 is then changed to a configuration where both the first sub-array 112L and the second I/O circuitry 112M are enabled. For any subsequent operating cycles, the gating circuit 115 will permit passage of the word line signals to the word lines for the memory cells C in the second sub-array 112M, and the logic circuit of control circuit CTRL will permit passage of the control signals 122 to the precharge circuit PCH, the multiplexing circuitry MUX, and the sense amplifier circuit SA of the I/O circuits 118 in the second I/O circuitry 112M. The read from and write to operations for the addressed location in the memory are thus performed using both the LESS significant bits (0 to x−1) and the MORE significant bits (x to k−1) of the first and second sub-arrays 112L and 112M, respectively.

Figure 6A:
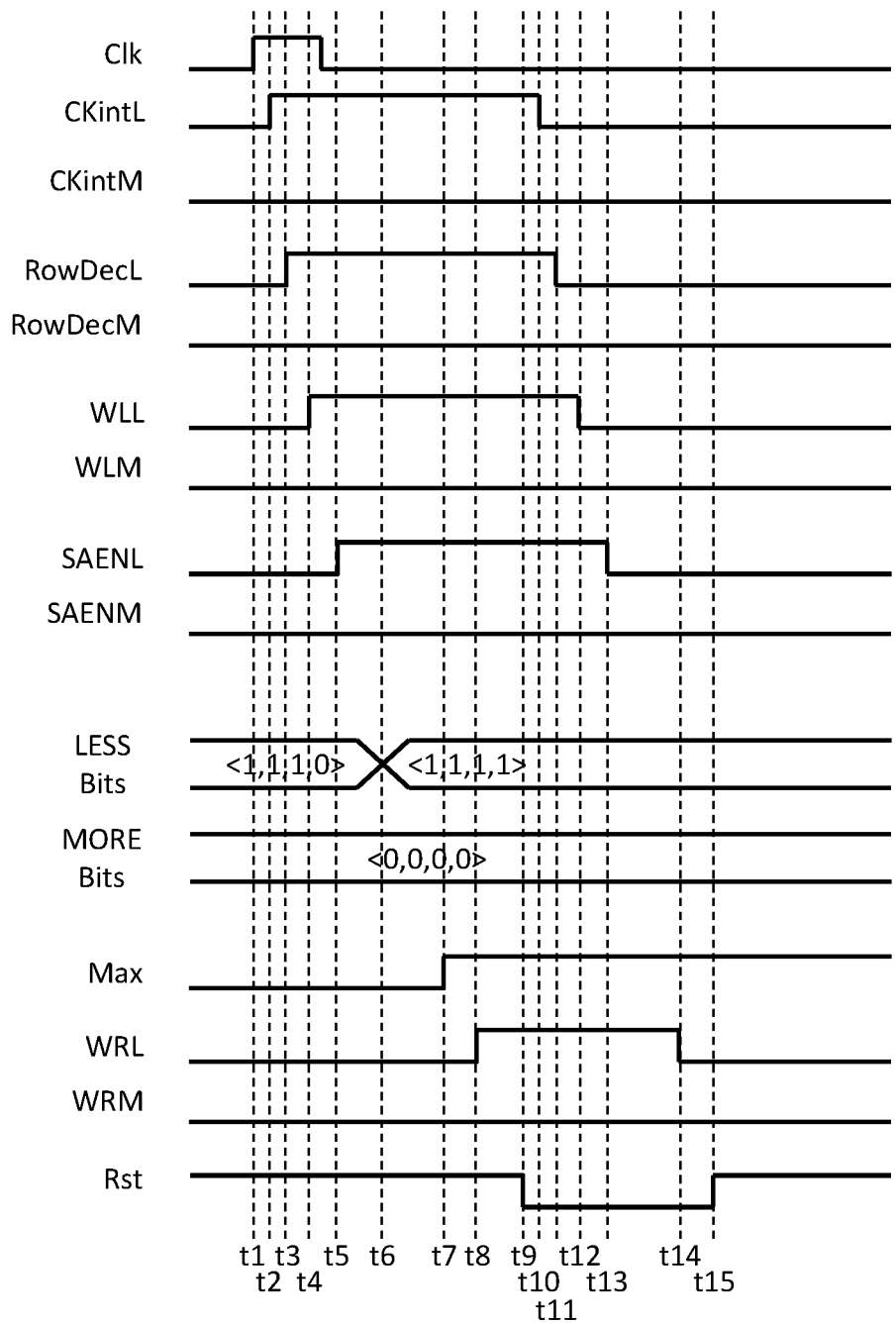
FIG. 6A is a timing diagram for operation of the circuit of FIG. 4 when the data modification operation produces a maximum count value for the LESS significant data bits.

Reference is now made to FIG. 6A which shows a timing diagram for operation of the circuit of FIG. 4 when the data modification operation produces a maximum count value for the LESS significant data bits (0 to x−1). A pulse of a system clock (Clk) is asserted at time t1 to begin the data operation. Responsive to the pulse of the system clock Clk, an internal clock (CKintL) for the first clock generator circuit (Clock Gen. Less) of the control circuit 120 pulses at time t2 in connection with enabling the first clock generator circuit (Clock Gen. Less) to apply the control signals 122 to the I/O circuits 118 of the first I/O circuitry 116L. Additionally, at time t3, the first clock generator circuit (Clock Gen. Less) asserts the first row decoder control signal (RowDecL) to enable the WL driver circuit of the row decoder. The row decoder then decodes the applied memory Address and asserts one of the word line signals for application to the first sub-array 112L (referred to as WLL) at time t4.

Because the memory gating control signal (Max) is not asserted, this being indicative of the fact that there is no previous instance for the LESS significant data bits (0 to x−1) reaching the maximum count value, an internal clock (CKintM) for the second clock generator circuit (Clock Gen. More) of the control circuit 120 remains deasserted. Consequently, the second clock generator circuit (Clock Gen. More) is not enabled to apply the control signals 122 to the I/O circuits 118 of the second I/O circuitry 116M, and the second row decoder control signal (RowDecM) is deasserted so as to block the word line signals from being applied by the gating circuit 115 of the row decoder to the word lines of the second sub-array 112M (referred to as WLM).

At time t5, the control circuit CTRL applies control signals 122 to the I/O circuits 118 of the first I/O circuitry 116L. This is indicated, in particular by example, with the assertion of the sense amplifier enable signal (SEANL) to actuate the sense amplifiers in the first I/O circuitry 116L to read the LESS significant data bits (0 to x−1) of the count value from the addressed location. In this case, the read count value is <1,1,1,0>. It will be noted that because the second clock generator circuit (Clock Gen. More) of the control circuit 120 is deasserted, there is no application by the control circuit CTRL of control signals 122 to the I/O circuits 118 of the second I/O circuitry 116M. This is indicated, in particular by example, with the continued deassertion of the sense amplifier enable signal (SEANM) for the sense amplifiers in the second I/O circuitry 116M.

At time t6, the increment by one operation is performed by the increment circuit 132 and the count value is modified to be <1,1,1,1>. This count value of <1,1,1,1> for the LESS significant data bits (0 to x−1) is the maximum possible count value. The maximum count detection circuit 135 detects this condition and asserts the memory gating control signal (Max) at time t7. It will be noted that this assertion of the memory gating control signal (Max) is a latched condition (see, reset input of the S-R latch in FIG. 5) that is kept in place until a memory reset occurs (see, set input of the S-R latch in FIG. 5) through the memory reset signal.

At time t8, the control circuit CTRL applies a further one of the control signals 122 to the I/O circuits 118 of the first I/O circuitry 116L to initiate a writing of the incremented count value for the LESS significant data bits (0 to x−1) with a value of <1,1,1,1,> back to the addressed memory location in the first sub-array 112L. This is indicated, in particular by example, with the assertion of the write enable signal (WRL) for the first I/O circuitry 116L. Again, because the second clock generator circuit (Clock Gen. More) of the control circuit 120 is deasserted, it will be noted that there is no application by the control circuit CTRL of control signals 122 to the I/O circuits 118 of the second I/O circuitry 116M, and thus the write enable signal (WRM) for the I/O circuits 118 of the second I/O circuitry 116M remains deasserted.

Following a detected completion of the write operation, the control circuit reset signal (Rst) is asserted logic low at time t9. The assertion of the control circuit reset signal (Rst) at time t9 triggers a series of events at times t10-t15 to reset the various clocks and signals (CKintL, RowDecL, WLL, SAENL, WRL and Rst) of the circuit in anticipation of a next cycle.

Figure 6B:
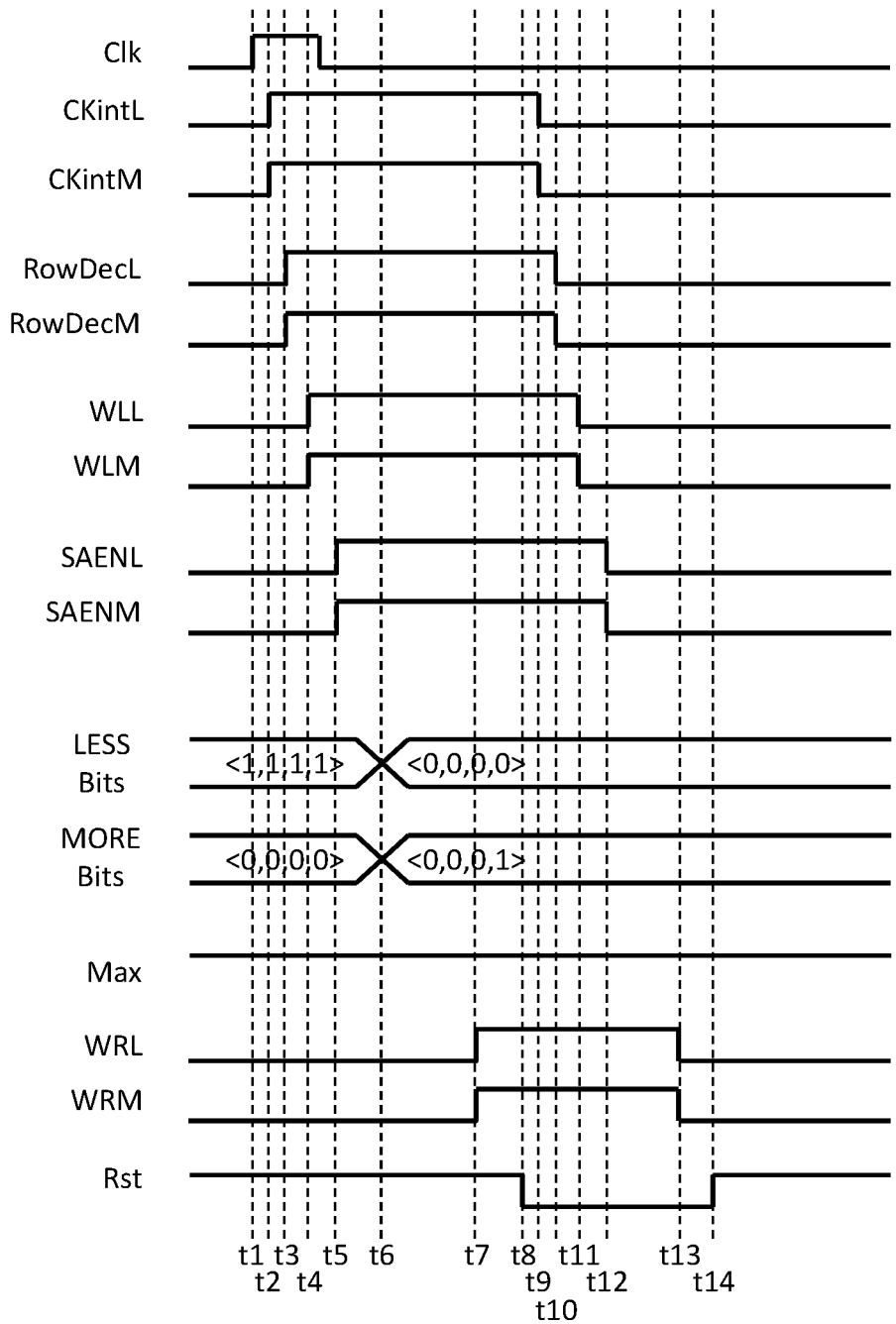
FIG. 6B is a timing diagram for operation of the circuit of FIG. 4 for the data modification operation after the maximum count value for the LESS significant data bits has been reached.

Reference is now made to FIG. 6B which shows a timing diagram for operation of the circuit of FIG. 4 for the data modification operation after the maximum count value for the LESS significant data bits (0 to x−1) has been reached. It will be noted that the memory gating control signal (Max) is latched in an asserted state because the maximum count value for the LESS significant data bits (0 to x−1) was reached in some previous cycle. A pulse of a system clock (Clk) is asserted at time t1 to begin the data operation. Responsive to the pulse of the system clock Clk, and the asserted state of the memory gating control signal (Max), the internal clocks (CKintL and CKintM) for the first and second clock generator circuits (Clock Gen. Less and Clock Gen. More) of the control circuit 120 both pulse at time t2 in connection with enabling the first and second clock generator circuits (Clock Gen. Less and Clock Gen. More) to apply the control signals 122 to the I/O circuits 118 of the first and second I/O circuitries 116L and 116M. Additionally, at time t3, the first clock generator circuit (Clock Gen. Less) asserts the first row decoder control signal (RowDecL) to enable the WL driver circuit of the row decoder and the second clock generator circuit (Clock Gen. More) asserts the second row decoder control signal (RowDecM) to enable the gating circuit 115. The row decoder then decodes the applied memory Address and asserts one of the word line signals for application to the first and second sub-arrays 112L and 112M (referred to as WLL and WLM) at time t4.

At time t5, the control circuit CTRL applies control signals 122 to the I/O circuits 118 of the first and second I/O circuitries 116L and 116M. This is indicated, in particular by example, with the assertion of the sense amplifier enable signal (SEANL) to actuate the sense amplifiers in the first I/O circuitry 116L to read the LESS significant data bits (0 to x−1) of the count value from the addressed location, and with the assertion of the sense amplifier enable signal (SEANM) to actuate the sense amplifiers in the second I/O circuitry 116M to read the MORE significant data bits (x to k−1) of the count value from the addressed location. In this case, the read count value is <0,0,0,0,1,1,1,1>, where <0,0,0,0> is the value of the MORE significant data bits (x to k−1) and <1,1,1,1> is the value of the LESS significant data bits (0 to x−1).

At time t6, the increment by one operation is performed by the increment circuit 132 and the count value is modified from <0,0,0,0,1,1,1,1> to <0,0,0,1,0,0,0,0>, where <0,0,0,1> are the MORE significant data bits (x to k−1) and <0,0,0,0> are the LESS significant data bits (0 to x−1). It will be noted that the assertion of the memory gating control signal (Max) is remains in the latched condition notwithstanding the fact that the LESS significant data bits (0 to x−1) are no longer indicative of the maximum count value.

At time t7, the control circuit CTRL applies a further one of the control signals 122 to the I/O circuits 118 of the first and second I/O circuitries 116L and 116M to initiate a writing of the incremented count value of <0,0,0,1,0,0,0,0> back to the addressed memory location in the first and second sub-arrays 112L and 112M. This is indicated, in particular by example, with the assertion of the write enable signal (WRL) for the first I/O circuitry 116L and the write enable signal (WRM) for the second I/O circuitry 116M.

Following a detected completion of the write operation, the control circuit reset signal (Rst) is asserted logic low at time t8. The assertion of the control circuit reset signal (Rst) at time t8 triggers a series of events at times t9-t14 to reset the various clocks and signals (CKintL, CKintM, RowDecL, RowDecM, WLL, WLM, SAENL, SAENM, WRL, WRM and Rst) of the circuit in anticipation of a next cycle.

In the architectural configuration shown in FIG. 4, the gating control signal (Max) is a single bit signal. Because of this, all rows of the memory cells C in the second sub-array 112M are either disabled (when the gating control signal (Max) is deasserted) or enabled (when the gating control signal (Max) is asserted). It will be recognized, however, that a higher degree of granularity for gating control with respect to the word lines of the memory can be exercised.

Figure 8:
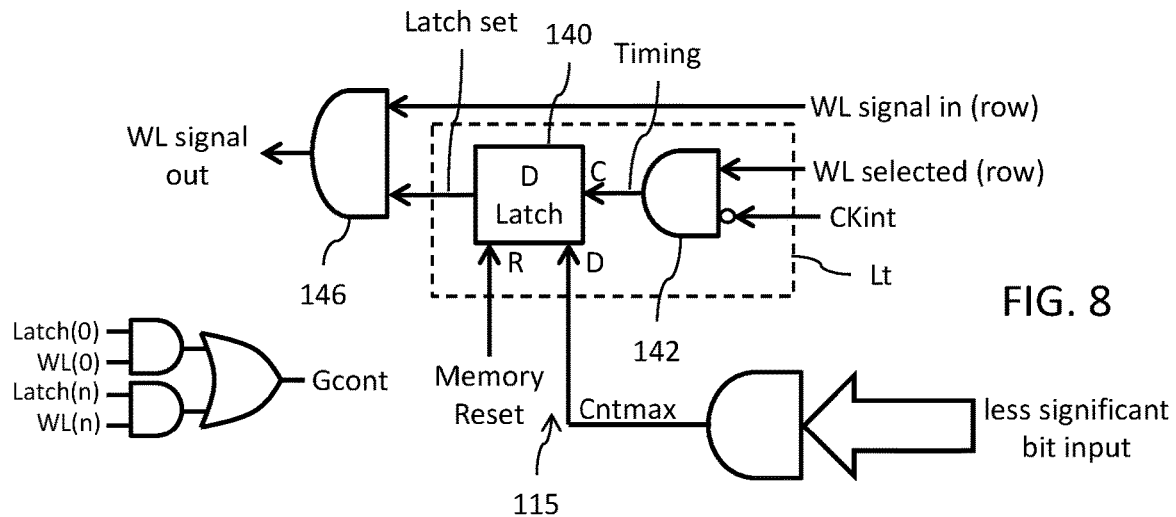
FIG. 8 shows a block diagram for a logic circuit.

FIGS. 7 and 8 show an embodiment that provides such a higher degree of granularity for word line gating control. The word line signal gating circuit 115 includes a logic AND gate 146 for each row. A first input of the logic AND gate 146 receives the word line signal for that row from the WL driver circuit. A second input of the logic AND gate 146 receives a gating control signal output from a latching circuit (Lt) that operates to selectively latch an asserted logic state of a maximum count control signal (Cntmax) on a row-by-row basis. Each latching circuit Lt includes a D-type latch 140 with an active high control configuration. The reset (R) input of the latch 140 is configured to receive a memory reset signal. When the memory reset signal is asserted (logic high) in connection with resetting all the count values to zero, the latch output is reset to logic low. In this configuration, the logic AND gate 146 will block passage of the word line signal for that row from the WL driver circuit to the word line of the second sub-array 112M. The clock (C) input of the latch 140 is configured to receive a latch timing control signal. The data (D) input of the latch 140 is configured to receive the maximum count control signal (Cntmax) that is generated by a logic AND gate configured to logically-AND all the LESS significant data bits (0 to x−1) for a given count value. When all of the LESS significant data bits are logic high, indicating that a maximum count value has been reached, the output of the logic AND gate is also logic high. In response to assertions of both the maximum count control signal (Cntmax) and the latch timing control signal, the latch output is changed to logic high. In this configuration, the logic AND gate 146 will pass the word line signal for that row from the WL driver circuit to the word line of the second sub-array 112M. The latch timing control signal is generated by a logic AND gate 142 having a first input configured to receive a word line selected signal which is asserted logic high by the row decoder 114 when the associated word line has been selected in response to decoding of the Address. A second input to the logic AND gate 142 receives the logical inversion of an internal clock signal CKint generated by the control circuit CTRL and associated with enabling operation of the WL driver circuit of the row decoder. Thus, the latch timing control signal is asserted only when both the word line selected signal is asserted and the internal clock signal CKint is deasserted.

This timing condition occurs only at the end of an operational cycle (as will be described in more detail below) and is used to ensure that the latch 140 is being set at a time when it is not possible for word line signals to be applied to the word lines of the second sub-array 112M (i.e., when the internal clock signal CKint has disabled the WL driver circuit). On the next cycle for the same address, the maximum count control signal (Cntmax) will be logic low because the less significant bits will no longer have the maximum count value. In response to the subsequent assertion of the timing signal from the AND gate 142, the latch 140 will be cleared (i.e., deasserted) and the corresponding row of memory cells C in the second sub-array 112M will return to being in a disabled condition through the gating of the word line signal provided by AND gate 146.

The control circuit CTRL includes a gating circuit 123 (shown here as a logical ANDing circuit) that selectively passes the control signals 122 to the I/O circuits 118 in the second I/O circuitry 112M in response to the logic state of a gate control signal (Gcont). The gate control signal (Gcont) is asserted logic high in response to the assertion of a word line signal by the row decoder through the WL driver circuit in logical combination (for example, logical AND) with its associated latch circuit 140 being set. In other words, the gate control signal (Gcont) will be asserted in response to the logical ORing of signals generated by logically ANDing the latch output with its associated word line selection signal. See, FIG. 8.

Overall operation of the circuit 130 will be better understood by consideration of the following. An initialization of the memory 110 is performed to reset all count values and further reset all latch circuits 140 using the memory reset signal. With the latches 140 in the reset state, the word line signal gating circuit 115 blocks word line signals from being applied to the word lines WL connected to the memory cells C in the second sub-array 112M and the logic circuit 123 of control circuit CTRL blocks control signals 122 from being applied to the precharge circuit PCH, the multiplexing circuitry MUX, and the sense amplifier circuit SA of the I/O circuits 118 in the second I/O circuitry 112M. In this operating configuration for the memory 110, the second sub-array 112M and the second I/O circuitry 112M are effectively disabled in support of a lower power consumption mode of operation. Counting, data modification and histogram generation is performed solely with respect to the first sub-array 112L and the first I/O circuitry 112L for the LESS significant bits (0 to x−1). In response to a received memory address (Address), the row decoder 114 performs a decoding operation and selects one word line WL to be asserted. The count value (Count) in the LESS significant bits (0 to x−1) is then read from the addressed data word location in the memory core 112 and output through the data output (Q) port of the SRAM 110. The data modification circuit 132 then performs the mathematical modify operation, which in this example case is an increment by one (+1) operation, and the modified count value (Count+1) is applied to the data input (D) port of the SRAM 110 to be written back to the addressed data word location. The foregoing process is repeated over and over again for each applied memory address (Address) to build the histogram with incremented count values and the gating control signal (Max) remains deasserted.

However, the operating configuration of the memory 110 changes in response to the instance where the mathematical modify operation generates a maximum count value for the LESS significant bits (0 to x−1). Let's assume as an example that the LESS significant bits (0 to x−1) at a certain data word location in the memory 110 currently store a count value of <1,1,1,0>. In response to a received memory address (Address) for that certain data word location, the row decoder 114 performs a decoding operation and selects the corresponding word line WL to be asserted. The count value (Count) of <1,1,1,0> in the LESS significant bits (0 to x−1) is then read from the addressed data word location in the memory core 112 and output through the data output (Q) port of the SRAM 110. The data modification circuit 132 then performs the mathematical modify operation, which in this example case is an increment by one (+1) operation, and the modified count value (Count+1) of <1,1,1,1> is generated. This maximum count value for the LESS significant bits (0 to x−1) is detected by the logical AND gate and the maximum count control signal (Cntmax) is asserted. At the end of the operation to write the modified count value back to the addressed data word location, the latch timing control signal is asserted and the latch circuit 140 responds to the assertions of both the latch timing control signal and the maximum count control signal (Cntmax) by setting the latch Lt output to logic high. The operating configuration for the memory 110 is then in a configuration where the first sub-array 112L is enabled and memory cells C on the word line (i.e., the row) of the second sub-array 112M where the associated latch Lt has been set is also enabled. For the next operating cycle with the same address, the gating circuit 115 will permit passage of the word line signals to the word lines for the memory cells C in the second sub-array 112M whose associated latch Lt been set. With at least one latch circuit 140 in the set condition, the gate control signal (Gcont) can be asserted during subsequent accesses to the memory (i.e., when the word line signal corresponding to any of the set latches Lt is applied) and the logic circuit 123 of control circuit CTRL will permit passage of the control signals 122 to the precharge circuit PCH, the multiplexing circuitry MUX, and the sense amplifier circuit SA of the I/O circuits 118 in the second I/O circuitry 112M. The read from and write to operations for the addressed location in the memory are thus performed using both the LESS significant bits (0 to x−1) and the MORE significant bits (x to k−1) of the first and second sub-arrays 112L and 112M, respectively.

Figure 9A:
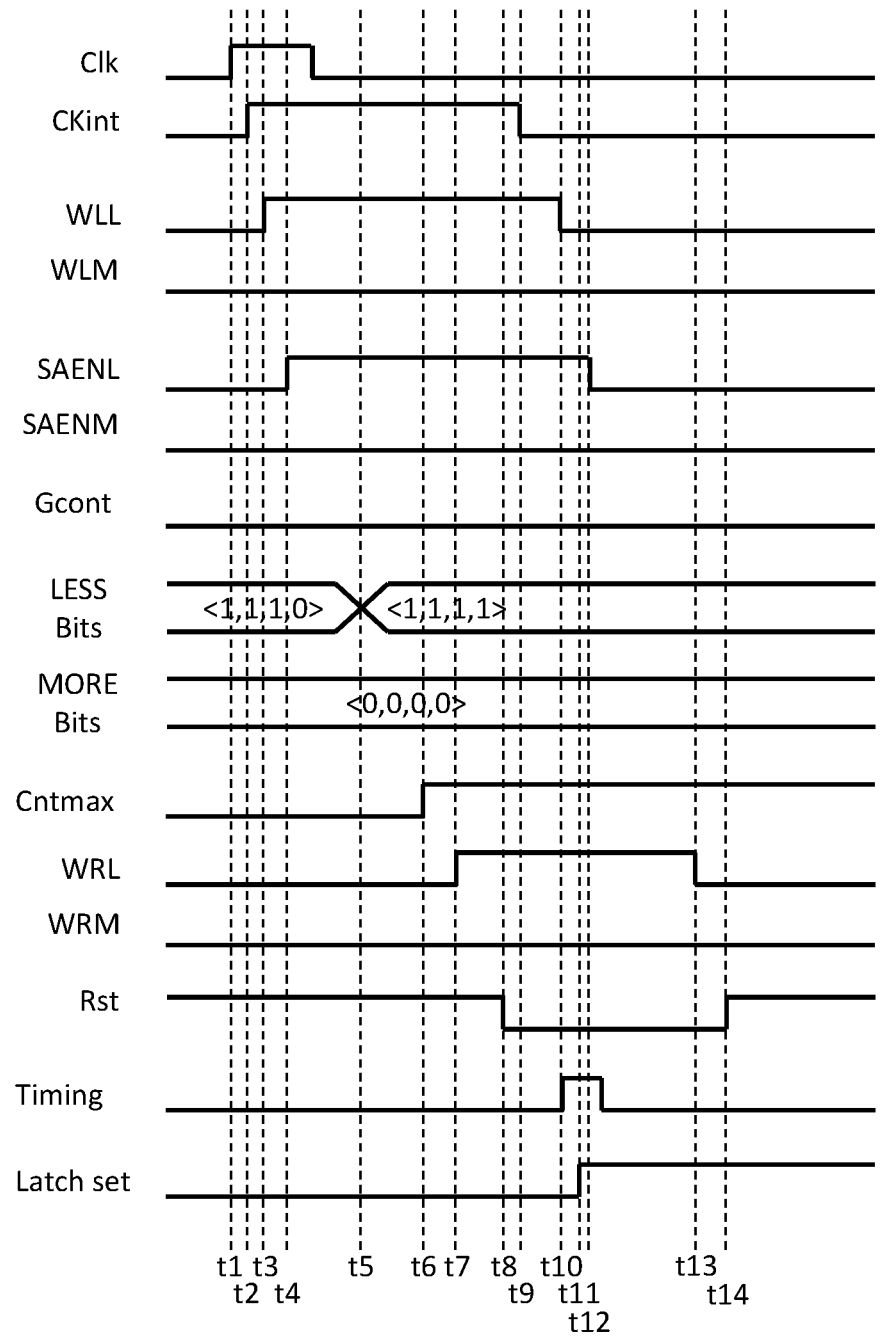
FIG. 9A is a timing diagram for operation of the circuit of FIG. 7 when the data modification operation produces a maximum count value for the LESS significant data bits.

Reference is now made to FIG. 9A which shows a timing diagram for operation of the circuit of FIG. 7 when the data modification operation produces a maximum count value for the LESS significant data bits (0 to x−1). A pulse of a system clock (Clk) is asserted at time t1 to begin the data operation. Responsive to the pulse of the system clock Clk, an internal clock (CKint) of the control circuit 120 pulses at time t2 in connection with enabling generation and application of the control signals 122 to the I/O circuits 118 of the first I/O circuitry 116L. Additionally, this internal clock (CKint) is applied to the row decoder to enable the WL driver circuit. The row decoder then decodes the applied memory Address and asserts one of the word line signals for application to the first sub-array 112L (referred to as WLL) at time t3.

Because no latch circuit 140 has yet been set, this being indicative of the fact that there is no past instance in the LESS significant data bits (0 to x−1) for a maximum count value being reached, the circuit 115 will block the word line signals from being applied to the word lines of the second sub-array 112M (referred to as WLM). Additionally, the gate control signal (Gcont) remains deasserted, and the gating circuit 123 will block control signals 122 from being applied to the I/O circuits 118 of the second I/O circuitry 116M.

At time t4, the control circuit CTRL applies control signals 122 to the I/O circuits 118 of the first I/O circuitry 116L. This is indicated, in particular by example, with the assertion of the sense amplifier enable signal (SEANL) to actuate the sense amplifiers in the first I/O circuitry 116L to read the LESS significant data bits (0 to x−1) of the count value from the addressed location. In this case, the read count value is <1,1,1,0>. It will be noted that because the gate control signal (Gcont) remains deasserted, there is no application by the control circuit CTRL of control signals 122 to the I/O circuits 118 of the second I/O circuitry 116M. This is indicated, in particular by example, with the continued deassertion of the sense amplifier enable signal (SEANM) for the sense amplifiers in the second I/O circuitry 116M.

At time t5, the increment by one operation is performed by the increment circuit 132 and the count value is modified to be <1,1,1,1>. This count value of <1,1,1,1> for the LESS significant data bits (0 to x−1) is the maximum possible count value, and this data condition is detected by the AND logic gate and the maximum count control signal (Cntmax) is asserted at time t6.

At time t7, the control circuit CTRL applies a further one of the control signals 122 to the I/O circuits 118 of the first I/O circuitry 116L to initiate a writing of the incremented count value for the LESS significant data bits (0 to x−1) back to the addressed memory location in the first sub-array 112L. This is indicated, in particular by example, with the assertion of the write enable signal (WRL) for the first I/O circuitry 116L. Again, because the gate control signal (Gcont) remains deasserted, it will be noted that there is no application by the control circuit CTRL of control signals 122 to the I/O circuits 118 of the second I/O circuitry 116M, and thus the write enable signal (WRM) for the I/O circuits 118 of the second I/O circuitry 116M remains deasserted.

Following a detected completion of the write operation, the control circuit reset signal (Rst) is asserted logic low at time t8. The assertion of the control circuit reset signal (Rst) at time t8 triggers a series of events at times t9, t10 and t12-t14 to reset the various clocks and signals (CKintL, RowDecL, WLL, SAENL, WRL and Rst) of the circuit in anticipation of a next cycle. Additionally, when the internal clock CKint is reset to logic low at time t9, and with the word line WLL remaining asserted, the latch clock input timing signal is asserted by the AND gate 142 at around time t10. With both the clock input and the data input of the latch circuit 140 (i.e., the maximum count control signal (Cntmax)) being simultaneously asserted, the output of the latch circuit 140 (i.e., the latch set signal) associated with the row where in the maximum possible count value is detected changes to the set state at time t11.

Figure 9B:
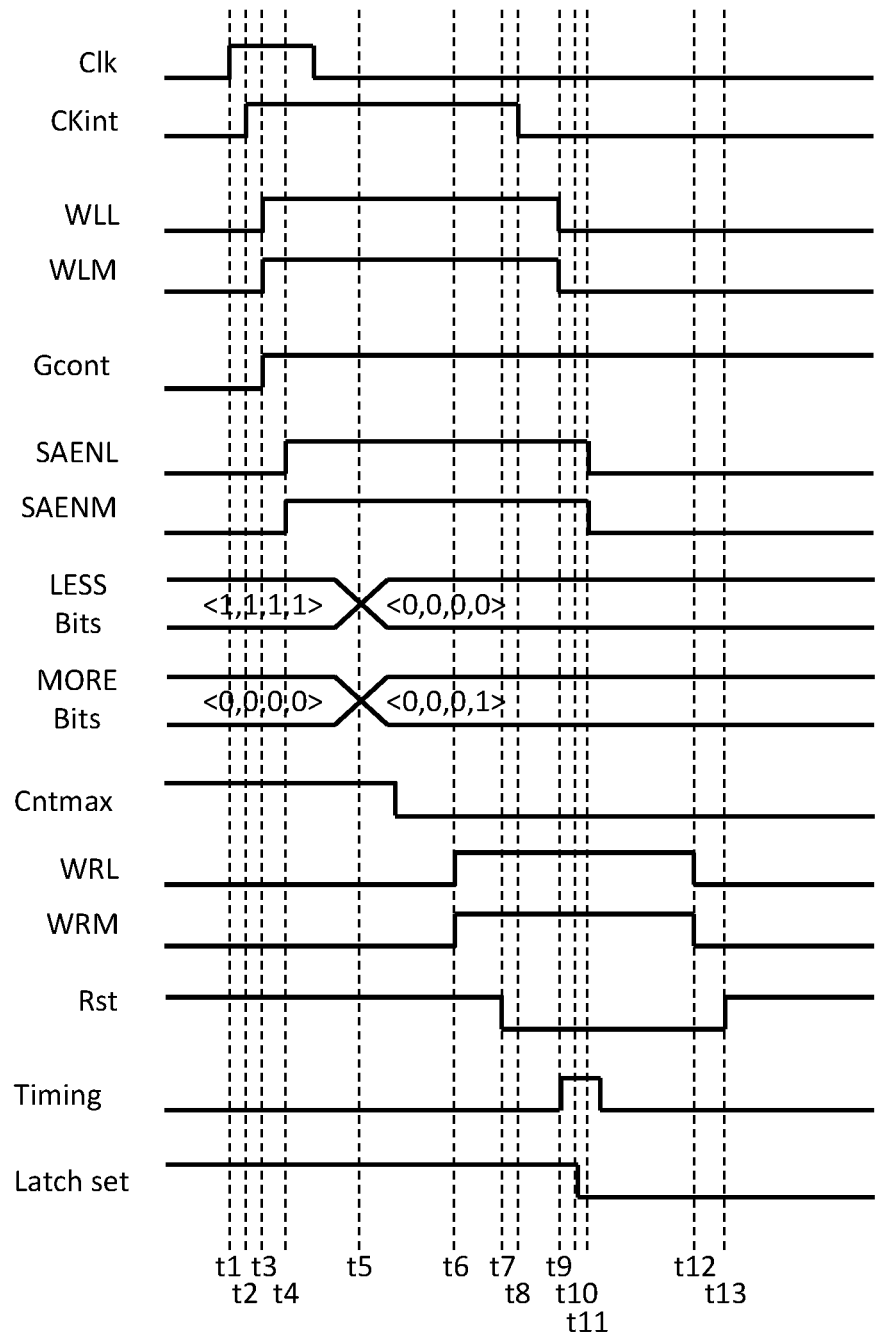
FIG. 9B is a timing diagram for operation of the circuit of FIG. 7 for the data modification operation after the maximum count value for the LESS significant data bits has been reached.

Reference is now made to FIG. 9B which shows a timing diagram for operation of the circuit of FIG. 7 for the data modification operation after the setting of the latch in response to the maximum count value for the LESS significant data bits (0 to x−1) having been reached. It will be noted that the latch circuit 140 corresponding to the word line for the memory location associated with the memory address used in the process shown in FIG. 9A is latched in the set state as shown by the logic high state of the latch set signal. A pulse of a system clock (Clk) is asserted at time t1 to begin the data operation. Responsive to the pulse of the system clock Clk, an internal clock (CKint) of the control circuit 120 pulses at time t2 in connection with enabling generation and application of the control signals 122 to the I/O circuits 118 of the first I/O circuitry 116L. Additionally, this internal clock (CKint) is applied to the row decoder to enable the WL driver circuit. It will be assumed here for this operation cycle that the memory Address is the same as the memory address applied in the process shown in FIG. 9A. The row decoder decodes the applied memory Address and asserts the same one of the word line signals. Because the latch circuit 140 associated with that selected word line is set, the corresponding AND gate 146 is enabled, and thus the asserted word line signal is applied at the corresponding row to the both first sub-array 112L (referred to as WLL) and the second sub-array 112M (referred to as WLM) at time t3.

In response to the setting of the latch circuit 140 and the assertion of its corresponding word line signal WLL by the row decoder, the gate control signal (Gcont) is also asserted at time t3 to enable the operation of the AND gate 123 of the control circuit CTRL.

At time t4, the control circuit CTRL applies control signals 122 to the I/O circuits 118 of the first and second I/O circuitries 116L and 116M. This is indicated, in particular by example, with the assertion of the sense amplifier enable signal (SEANL) to actuate the sense amplifiers in the first I/O circuitry 116L to read the LESS significant data bits (0 to x−1) of the count value from the addressed location, and with the assertion of the sense amplifier enable signal (SEANM) to actuate the sense amplifiers in the second I/O circuitry 116M to read the MORE significant data bits (x to k−1) of the count value from the addressed location. In this case, the read count value is <0,0,0,0,1,1,1,1>, where <0,0,0,0> are the MORE significant data bits (x to k−1) and <1,1,1,1> are the LESS significant data bits (0 to x−1).

At time t5, the increment by one operation is performed by the increment circuit 132 and the count value is modified from <0,0,0,0,1,1,1,1> to <0,0,0,1,0,0,0,0>, where <0,0,0,1> are the MORE significant data bits (x to k−1) and <0,0,0,0> are the LESS significant data bits (0 to x−1).

At time t6, the control circuit CTRL applies a further one of the control signals 122 to the I/O circuits 118 of the first and second I/O circuitries 116L and 116M to initiate a writing of the incremented count value of <0,0,0,1,0,0,0,0> back to the addressed memory location in the first and second sub-arrays 112L and 112M. This is indicated, in particular by example, with the assertion of the write enable signal (WRL) for the first I/O circuitry 116L and the write enable signal (WRM) for the second I/O circuitry 116M. It will be noted here that because the LESS significant bits of the count value are <0,0,0,0> that the maximum count control signal (Cntmax) is deasserted logic low.

Following a detected completion of the write operation, the control circuit reset signal (Rst) is asserted logic low at time t7. The assertion of the control circuit reset signal (Rst) at time t7 triggers a series of events at times t8, t9 and t11-t13 to reset the various clocks and signals (CKintL, CKintM, RowDecL, RowDecM, WLL, WLM, SAENL, SAENM, WRL, WRM and Rst) of the circuit in anticipation of a next cycle. Additionally, when the internal clock CKint is reset to logic low at time t8, and with the word line WLL remaining asserted, the latch clock input timing signal is asserted by the AND gate 142 at time t19. With the clock input asserted and the data input of the latch circuit 140 (the maximum count control signal (Cntmax)) deasserted, the output of the latch circuit 140 (i.e., the latch set signal) associated with the row changes back to the logic low set state at time t10.

Figure 10:
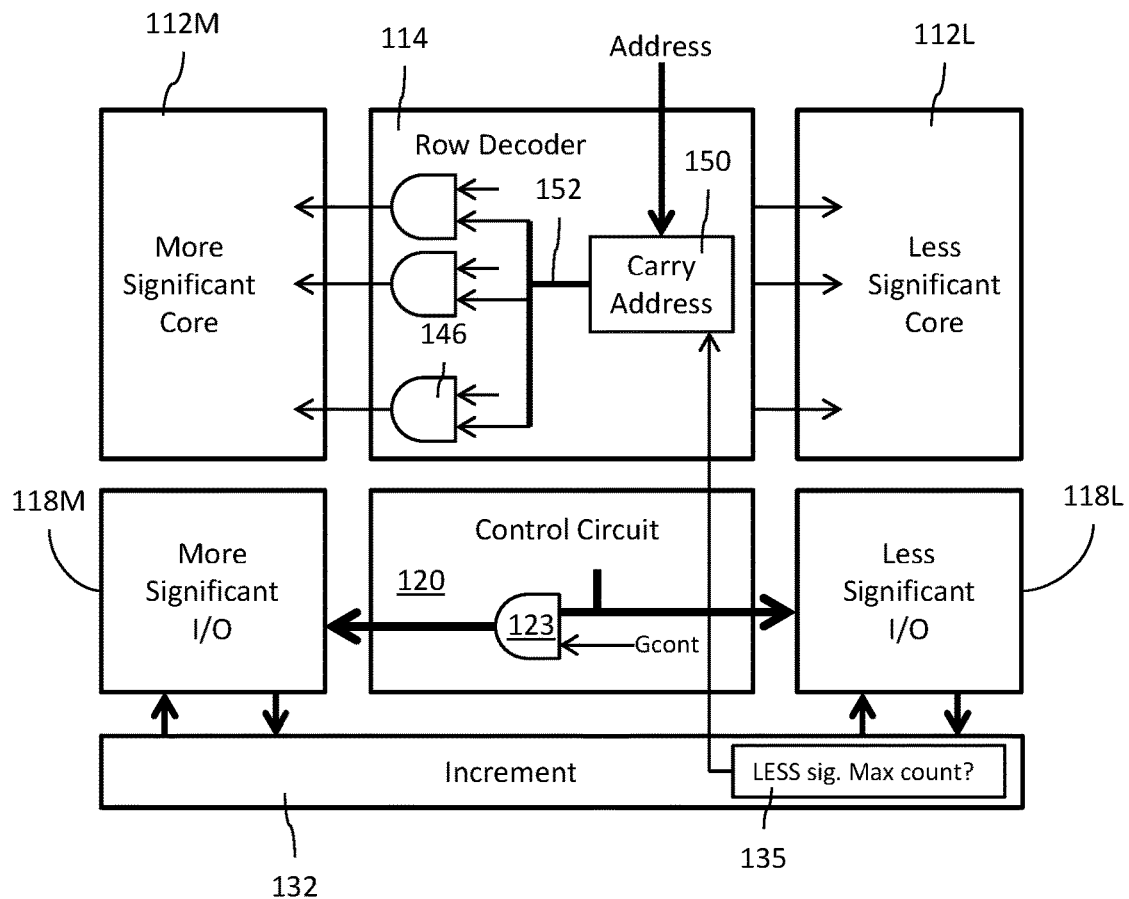

FIG. 10 shows another embodiment that provides such a higher degree of granularity for word line gating control. In this embodiment, an address storage circuit 150 in the row decoder 114 stores the memory address (Address) for each data storage location (i.e., row) where there has been an assertion of the gating control signal (Max) due to the detection of the case where the LESS significant bits (0 to x−1) of the count value have reached a maximum count value. The address storage circuit 150 decodes the stored addresses and asserts a gating control signal 152 which is applied to the second input of the logic AND gate 146 for the row corresponding to the decoded address. The first input of the logic AND gate 146 receives the word line signal for the row from the WL driver circuit. After reset, no addresses are stored in the address storage circuit 150 and the second sub-array 112M is disabled through the blocking of the word line signals by the AND gates 146. However, for each instance where the gating control signal (Max) is asserted during the building of the histogram, the address storage circuit 150 stores the memory address which is currently being applied, and that address is decoded in the row decoder 114 to assert the corresponding gating control signal 152 for selectively enabling the row of memory cells in the second sub-array 112M to receive the word line signal through the gating provided by the AND gate 146.

The gating circuit 123 of the control circuit CTRL selectively gates the control signals 122 for application to the I/O circuits 118 of the second I/O circuitry 116M in response to a gate control Gcont signal. This gate control Gcont signal is asserted each time the address storage circuit 150 asserts one of the gating control signals 152.

There is a further advantage provided by use of the address storage circuit 150 in FIG. 10 to store the addresses where the gating control signal (Max) has been asserted due to the mathematical modify operation for the LESS significant bits reaching a maximum count value. The memory locations corresponding to these saved memory addresses will obviously be storing the higher magnitude count values. In most histogram operations, it is the higher count values which are most important or of greater interest. With knowledge of the memory locations where these higher count values are stored, the system can use the addresses stored in the address storage circuit 150 in connection with performing a selective read out of the histogram data from the memory 110. Because that read operation is limited to only those addresses stored in the address storage circuit 150, the operation can be executed in a more power and time efficient manner.

As a further enhancement, only a limited number of addresses are stored in the address storage circuit 150, where those addresses represent the memory locations where the highest count values are stored. A test can be performed by the address storage circuit 150 to track the number of times a certain address is received for a memory location where the gating control signal (Max) has been asserted, and only the addresses which have been asserted most (or more than a certain threshold) number of times are saved. With knowledge of the memory locations where the highest count values are stored, the system can use the addresses stored in the address storage circuit 150 in connection with performing a selective read out of the histogram data from the memory 110. Because that read operation is limited to only a select few addresses stored in the address storage circuit 150, the operation can be executed in a more power and time efficient manner.

As yet another enhancement, the address storage circuit 150 can be further configured to store an identification (for example, through the use of a flag) of the individual stored address that is associated with the single highest count value. With knowledge of that information, the system can use the flagged address that is stored in the address storage circuit 150 in connection with performing a specific read out from the memory 110 of only that highest count value for the histogram data. Because that read operation is limited to a single address stored in the address storage circuit 150, the operation can be executed with an even greater efficiency in terms of power and time.

Figure 11:
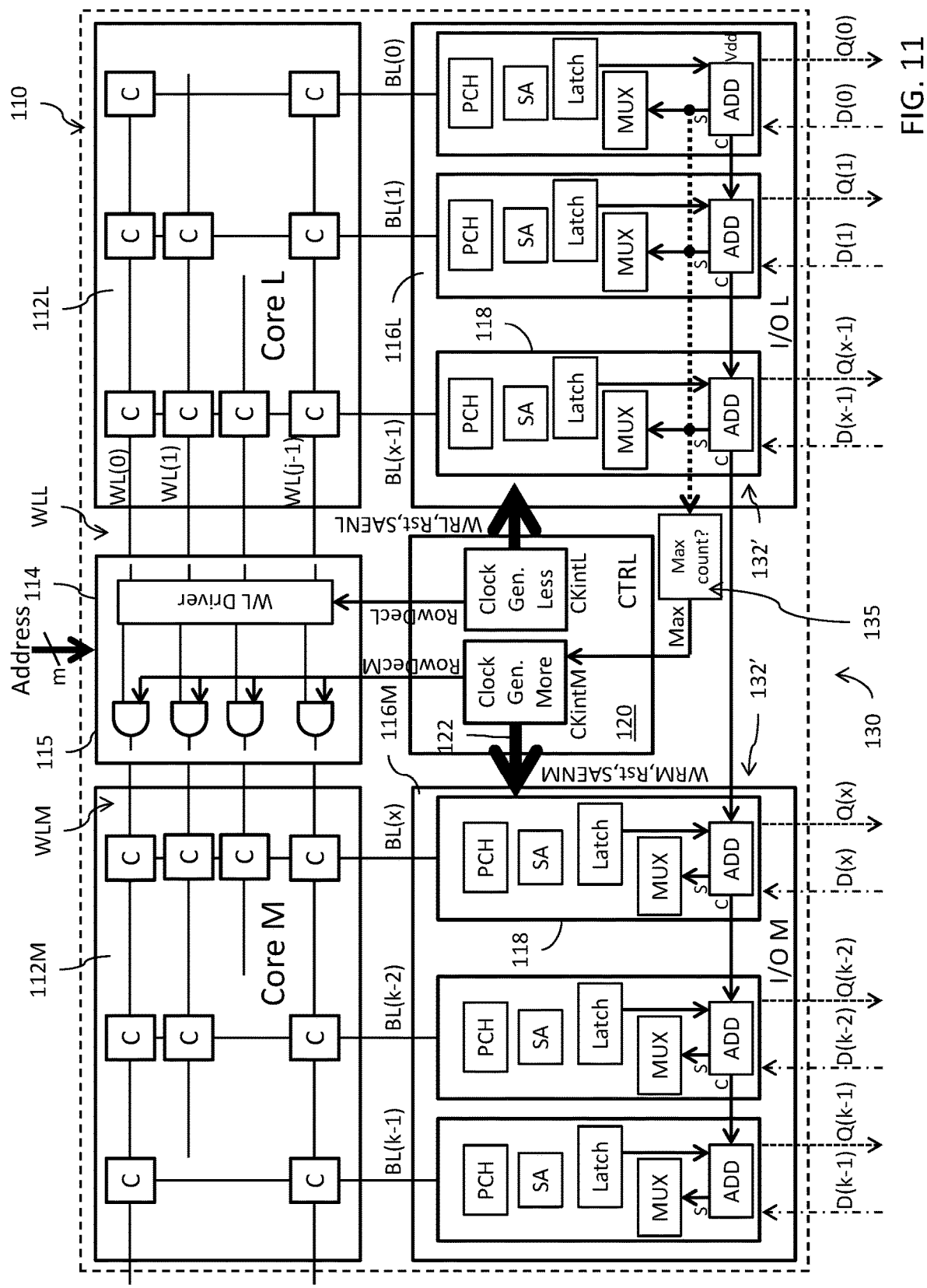

The circuit 130 as shown in FIGS. 4, 7 and 10 utilizes an external data modification circuit 132 that is coupled to the data output (Q) port and data input (D) port of the memory 110. In an alternative embodiment as shown in FIG. 11, the step 2) operation for mathematically modifying the count value is performed internally within the SRAM 110. This is an advantageous solution in terms of further reducing power consumption because there is no need to toggle data signals at the data output (Q) port and data input (D) port of the SRAM 110 or power external circuits in connection with implementing the increment operation. The configuration of the circuit 130 in FIG. 11 is similar to the configuration of the circuit 130 in FIG. 4, except as is described below.

The memory includes an internal data modification circuit 132' that operates to perform a data modification on the bits of the count value which are latched by the Latch circuit from the sense amplifier SA. The data modification circuit 132' comprises an n-bit adder circuit that operates on the latched data word (which is the current count value stored in the memory) to increment by one and output the modified data word (i.e., Count+1).

The n-bit adder for the internal data modification circuit 132' is formed by a plurality of half adder (ADD) circuits, wherein each ADD circuit can be implemented as a component of each I/O circuit 118. Each ADD circuit includes a first input that is coupled to receive the latched data bit from its corresponding Latch circuit of the I/O circuit 118 and a second input that is coupled to a carry output of a preceding ADD circuit (except for the first ADD circuit associated with the least significant bit column which is coupled to a logic high voltage supply node (Vdd) for the second input). Each ADD circuit further includes a sum output (S) that is coupled to the MUX circuit and a carry output (C) that is coupled to the second input of a succeeding ADD circuit. The plurality of ADD circuits in the data input/output (I/O) circuitry 116 function to perform an increment by one operation on the data word provided by the bits latched by the Latch circuits.

A maximum count detection circuit 135 within the memory is coupled to the sum outputs (S) for the ADD circuits of the LESS significant bits 0 to x−1. The maximum count detection circuit 135 operates to determine whether the data modification operation performed by the internal data modification circuit 132' on the LESS significant bits 0 to x−1 produced a maximum count value. The assertion of the gating control signal (Max) is dependent on that determination.

The gating control signal (Max) is deasserted whenever the data modification operation performed by the ADD circuits generates an output for the LESS significant bits 0 to x−1 which does not have a maximum value. As an example, consider a scenario where the LESS significant data bits (0 to x−1) saved in the Latch circuits of the I/O circuit 116L are <1,1,0,1> (for x=4) and the result of the increment by one performed by the ADD circuits produces LESS significant data bits (0 to x−1) for application to the MUX circuits of <1,1,1,0>. In this case, the gating control signal (Max) is deasserted. Conversely, consider the scenario where the LESS significant data bits (0 to x−1) in the Latch circuits of the I/O circuit 116L are <1,1,1,0> and the result of the increment by one performed by the AND circuits produces LESS significant data bits (0 to x−1) for application to the MUX circuits of <1,1,1,1>. In this case, the gating control signal (Max) is asserted.

Overall operation of the circuit 130 will be better understood by consideration of the following. An initialization of the memory 110 is performed to reset all count values and the gating control signal (Max) is deasserted. With the gating control signal (Max) deasserted, the word line signal gating circuit 115 blocks word line signals from being applied to the word lines WL connected to the memory cells C in the second sub-array 112M and the logic circuit of control circuit CTRL blocks control signals 122 from being applied to the precharge circuit PCH, the multiplexing circuitry MUX, and the sense amplifier circuit SA of the I/O circuits 118 in the second I/O circuitry 112M. In this operating configuration for the memory 110, the second sub-array 112M and the second I/O circuitry 112M are effectively disabled in support of a lower power consumption mode of operation. Counting, data modification and histogram generation is performed solely with respect to the first sub-array 112L and the first I/O circuitry 112L for the LESS significant bits (0 to x−1). In response to a received memory address (Address), the row decoder 114 performs a decoding operation and selects one word line WL to be asserted. The count value (Count) in the LESS significant bits (0 to x−1) is then read from the addressed data word location in the memory core 112 and latched in the I/O circuit of the memory. The internal data modification circuit 132' then performs the mathematical modify operation, which in this example case is an increment by one (+1) operation, and the modified count value (Count+1) is written through the MUX circuits back to the addressed data word location. The foregoing process is repeated over and over again for each applied memory address (Address) to build the histogram with incremented count values and the gating control signal (Max) remains deasserted.

However, the operating configuration of the memory 110 changes in response to the instance where the mathematical modify operation generates a maximum count value for the LESS significant bits (0 to x−1). Let's assume as an example that the LESS significant bits (0 to x−1) at a certain data word location in the memory 110 currently store a count value of <1,1,1,0>. In response to a received memory address (Address) for that certain data word location, the row decoder 114 performs a decoding operation and selects the corresponding word line WL to be asserted. The count value (Count) of <1,1,1,0> in the LESS significant bits (0 to x−1) is then read from the addressed data word location in the memory core 112 and latched in the I/O circuit of the memory. The internal data modification circuit 132' then performs the mathematical modify operation, which in this example case is an increment by one (+1) operation, and the modified count value (Count+1) of <1,1,1,1> is generated and written through the MUX circuits back to the addressed data word location. This maximum count value for the LESS significant bits (0 to x−1) is detected by the maximum count detection circuit 135 and in response thereto the gating control signal (Max) is asserted. The operating configuration for the memory 110 is then changed to a configuration where both the first sub-array 112L and the second I/O circuitry 112M are enabled. For any subsequent operating cycles, the gating circuit 115 will permit passage of the word line signals to the word lines for the memory cells C in the second sub-array 112M, and the logic circuit of control circuit CTRL will permit passage of the control signals 122 to the precharge circuit PCH, the multiplexing circuitry MUX, and the sense amplifier circuit SA of the I/O circuits 118 in the second I/O circuitry 112M. The read from and write to operations for the addressed location in the memory are thus performed using both the LESS significant bits (0 to x−1) and the MORE significant bits (x to k−1) of the first and second sub-arrays 112L and 112M, respectively.

Figure 12A:
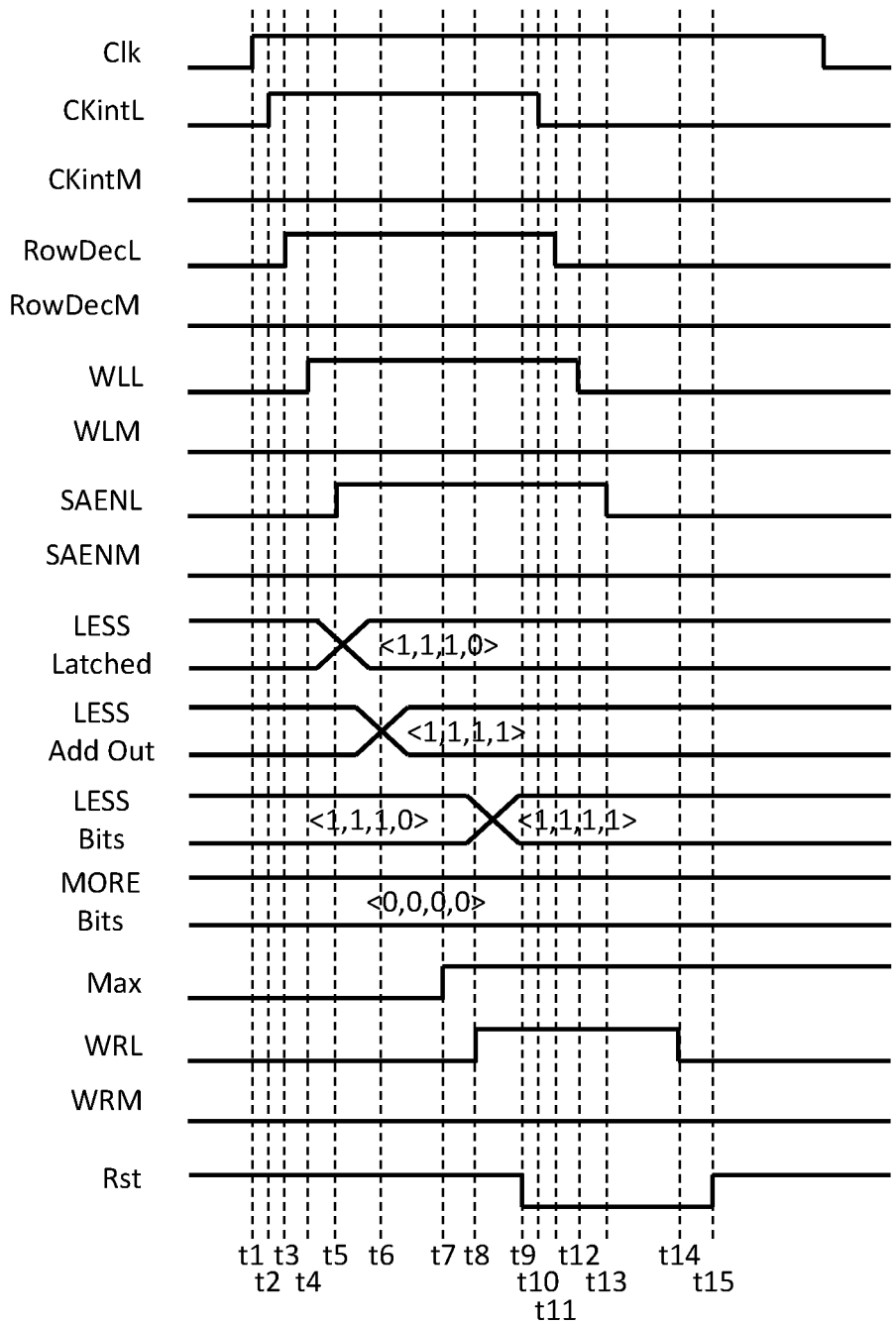
FIG. 12A is a timing diagram for operation of the circuit of FIG. 11 when the data modification operation produces a maximum count value for the LESS significant data bits.

Reference is now made to FIG. 12A which shows a timing diagram for operation of the circuit of FIG. 11 when the data modification operation produces a maximum count value for the LESS significant data bits (0 to x−1). A pulse of a system clock (Clk) is asserted at time t1 to begin the data operation. Responsive to the pulse of the system clock Clk, an internal clock (CKintL) for the first clock generator circuit (Clock Gen. Less) of the control circuit 120 pulses at time t2 in connection with enabling the first clock generator circuit (Clock Gen. Less) to apply the control signals 122 to the I/O circuits 118 of the first I/O circuitry 116L. Additionally, at time t3, the first clock generator circuit (Clock Gen. Less) asserts the first row decoder control signal (RowDecL) to enable the WL driver circuit of the row decoder. The row decoder then decodes the applied memory Address and asserts one of the word line signals for application to the first sub-array 112L (referred to as WLL) at time t4.

Because the memory gating control signal (Max) is not asserted, this being indicative of the fact that there is no previous instance of the LESS significant data bits (0 to x−1) reaching the maximum count value, an internal clock (CKintM) for the second clock generator circuit (Clock Gen. More) of the control circuit 120 remains deasserted. Consequently, the second clock generator circuit (Clock Gen. More) is not enabled to apply the control signals 122 to the I/O circuits 118 of the second I/O circuitry 116M, and the second row decoder control signal (RowDecM) is deasserted so as to block the word line signals from being applied by the gating circuit 115 of the row decoder to the word lines of the second sub-array 112M (referred to as WLM).

At time t5, the control circuit CTRL applies control signals 122 to the I/O circuits 118 of the first I/O circuitry 116L. This is indicated, in particular by example, with the assertion of the sense amplifier enable signal (SEANL) to actuate the sense amplifiers in the first I/O circuitry 116L to read the LESS significant data bits (0 to x−1) of the count value from the addressed location. In this case, the read count value is <1,1,1,0> which is latched by the latch circuits associated with the LESS significant data bits (0 to x−1). It will be noted that because the second clock generator circuit (Clock Gen. More) of the control circuit 120 is deasserted, there is no application by the control circuit CTRL of control signals 122 to the I/O circuits 118 of the second I/O circuitry 116M. This is indicated, in particular by example, with the continued deassertion of the sense amplifier enable signal (SEANM) for the sense amplifiers in the second I/O circuitry 116M.

At time t6, the increment by one operation is performed by the internal increment circuit 132' and the adder output count value is <1,1,1,1>. This count value of <1,1,1,1> for the LESS significant data bits (0 to x−1) at the adder output is the maximum possible count value. The maximum count detection circuit 135 detects this condition and asserts the memory gating control signal (Max) at time t7. It will be noted that this assertion of the memory gating control signal (Max) is a latched condition (see, reset input of the S-R latch in FIG. 5) that is kept in place until a memory reset occurs (see, set input of the S-R latch in FIG. 5) through the memory reset signal.

At time t8, the control circuit CTRL applies a further one of the control signals 122 to the I/O circuits 118 of the first I/O circuitry 116L to initiate a writing of the incremented count value for the LESS significant data bits (0 to x−1) back to the addressed memory location in the first sub-array 112L through the MUX circuits. This is indicated, in particular by example, with the assertion of the write enable signal (WRL) for the first I/O circuitry 116L. Again, because the second clock generator circuit (Clock Gen. More) of the control circuit 120 is deasserted, it will be noted that there is no application by the control circuit CTRL of control signals 122 to the I/O circuits 118 of the second I/O circuitry 116M, and thus the write enable signal (WRM) for the I/O circuits 118 of the second I/O circuitry 116M remains deasserted.

Following a detected completion of the write operation, the control circuit reset signal (Rst) is asserted logic low at time t9. The assertion of the control circuit reset signal (Rst) at time t9 triggers a series of events at times t10-t15 to reset the various clocks and signals (CKintL, RowDecL, WLL, SAENL, WRL and Rst) of the circuit in anticipation of a next cycle.

Figure 12B:
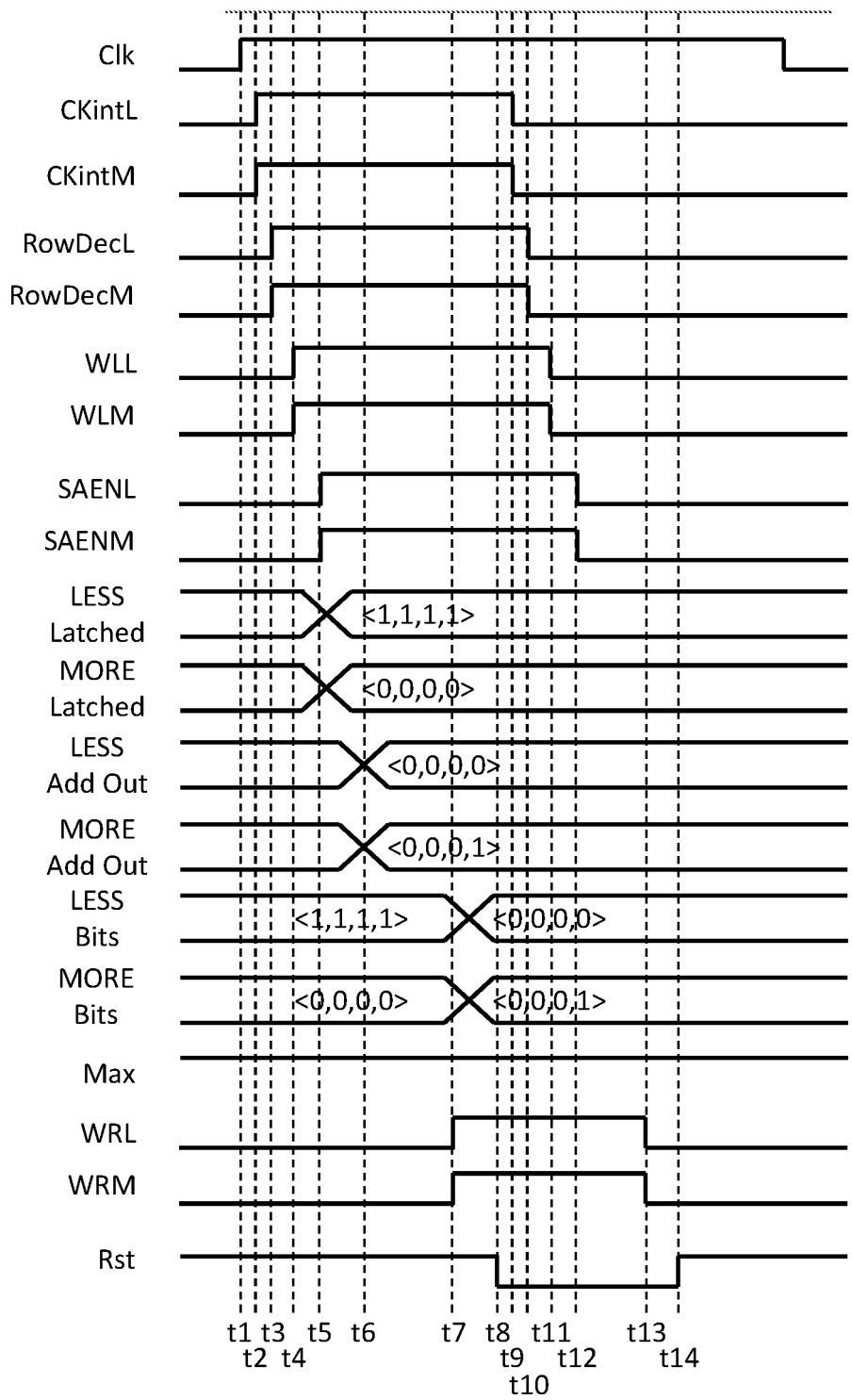
FIG. 12B is a timing diagram for operation of the circuit of FIG. 11 for the data modification operation after the maximum count value for the LESS significant data bits has been reached.

Reference is now made to FIG. 12B which shows a timing diagram for operation of the circuit of FIG. 11 for the data modification operation after the maximum count value for the LESS significant data bits (0 to x−1) has been reached. It will be noted that the memory gating control signal (Max) is latched in an asserted state because the maximum count value for the LESS significant data bits (0 to x−1) was reached in some previous cycle. A pulse of a system clock (Clk) is asserted at time t1 to begin the data operation. Responsive to the pulse of the system clock Clk, and the asserted state of the memory gating control signal (Max), the internal clocks (CKintL and CKintM) for the first and second clock generator circuits (Clock Gen. Less and Clock Gen. More) of the control circuit 120 pulses at time t2 in connection with enabling the first and second clock generator circuits (Clock Gen. Less and Clock Gen. More) to apply the control signals 122 to the I/O circuits 118 of the first and second I/O circuitries 116L and 116M. Additionally, at time t3, the first clock generator circuit (Clock Gen. Less) asserts the first row decoder control signal (RowDecL) to enable the WL driver circuit of the row decoder and the second clock generator circuit (Clock Gen. More) asserts the second row decoder control signal (RowDecM) to enable the gating circuit 115. The row decoder then decodes the applied memory Address and asserts one of the word line signals for application to the first and second sub-arrays 112L and 112M (referred to as WLL and WLM) at time t4.

At time t5, the control circuit CTRL applies control signals 122 to the I/O circuits 118 of the first and second I/O circuitries 116L and 116M. This is indicated, in particular by example, with the assertion of the sense amplifier enable signal (SEANL) to actuate the sense amplifiers in the first I/O circuitry 116L to read the LESS significant data bits (0 to x−1) of the count value from the addressed location, and with the assertion of the sense amplifier enable signal (SEANM) to actuate the sense amplifiers in the second I/O circuitry 116M to read the MORE significant data bits (x to k−1) of the count value from the addressed location. In this case, the read count value is <0,0,0,0,1,1,1,1> which is latched by the latch circuits, where <0,0,0,0> are the latched MORE significant data bits (x to k−1) and <1,1,1,1> are the latched LESS significant data bits (0 to x−1).

At time t6, the increment by one operation is performed by the increment circuit 132 and the count value is modified from <0,0,0,0,1,1,1,1> to <0,0,0,1,0,0,0,0>, where <0,0,0,1> are the MORE significant data bits (x to k−1) generated by the adder circuits and <0,0,0,0> are the LESS significant data bits (0 to x−1) generated by the adder circuits. It will be noted that this assertion of the memory gating control signal (Max) is remains in the latched condition notwithstanding the fact that the LESS significant data bits (0 to x−1) are no longer indicative of the maximum count value.

At time t7, the control circuit CTRL applies a further one of the control signals 122 to the I/O circuits 118 of the first and second I/O circuitries 116L and 116M to initiate a writing of the incremented count value of <0,0,0,1,0,0,0,0> back to the addressed memory location in the first and second sub-arrays 112L and 112M. This is indicated, in particular by example, with the assertion of the write enable signal (WRL) for the first I/O circuitry 116L and the write enable signal (WRM) for the second I/O circuitry 116M.

Following a detected completion of the write operation, the control circuit reset signal (Rst) is asserted logic low at time t8. The assertion of the control circuit reset signal (Rst) at time t8 triggers a series of events at times t9-t14 to reset the various clocks and signals (CKintL, CKintM, RowDecL, RowDecM, WLL, WLM, SAENL, SAENM, WRL, WRM and Rst) of the circuit in anticipation of a next cycle.

The implementation of the word line signal gating circuit 115 and the control signal gating circuit 123 shown in FIG. 11 corresponds to the implementation of FIG. 4. It will be understood, however, that the implementation of the word line signal gating circuit 115 and the control signal gating circuit 123 as shown in FIGS. 7 and/or 10, which show used of the external data modification circuit 132, could instead be used with the internal data modification circuit 132' as shown in FIG. 11.

Figure 13:
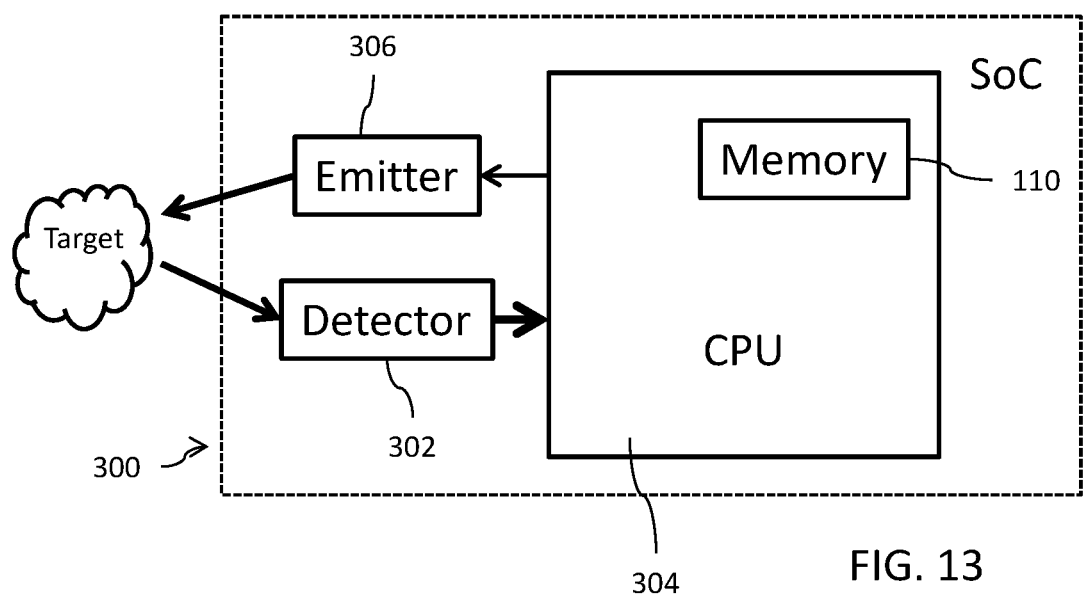
FIG. 13 is a schematic representation of a device, for example in form of an image sensor, which utilizes the memory of FIG. 4, 7, 10 or 11.

Reference is now made to FIG. 13 which shows a schematic representation of a device 300 which utilizes the memory 110 of FIG. 4, 7, 10 or 11. The device 300 may, for example, comprise an image sensor in the form of a System on Chip (SoC) that includes a photosensitive circuit 302 having output that is processed by a central processing unit 304. The circuit 110 may, for example, comprise a memory which is coupled to or embedded in the central processing unit 304. In a particularly pertinent example, the image sensor may comprise a time of flight (ToF) sensor as is well known in the art. Such a sensor includes an emitter circuit 306 configured to emit light pulses which are reflected by a target back towards the photosensitive circuit 302. In response to detections of the reflected light pulses, the circuit 110 is accessed by the CPU 304 at memory addresses associated with timing measurements. Each access causes a mathematical modification (for example, increment by one) of a stored count value which over time provides histogram data useful in identifying targets and the distances to those targets.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A circuit, comprising:
   a memory circuit including:
      a memory core formed by an array of memory cells storing data words at rows, wherein each row is connected to a word line, and wherein said array is arranged to include a first sub-array storing less significant bits of said data words and a second sub-array storing more significant bits of said data words; and
      a row decoder circuit configured to receive an address, decode the received address and generate a word line signal that is applied to a selected one of the word lines for a certain data location based on the decoded address;
a data modification circuit configured to perform a mathematical operation on a data word read from said certain data location in the array of memory cells corresponding to the selected one of the word lines in order to produce a modified data word that is written back to that certain data location in the array of memory cells;
wherein the row decoder further includes a word line gating circuit configured to selectively gate passage of the word line signal to memory cells of the second sub-array in response to assertion of a maximum value signal; and
a detection circuit configured to assert said maximum value signal in response to a determination that the mathematical operation performed on the less significant bits of said data word from the first sub-array produces a maximum data value for the less significant bits of said data word.

2. The circuit of claim 1, wherein said data modification circuit is external to the memory circuit.

3. The circuit of claim 1, wherein said data modification circuit is internal to the memory circuit.

4. The circuit of claim 1, wherein the mathematical operation comprises one of an increment operation, a decrement operation or a multiply operation.

5. The circuit of claim 1, wherein the word line gating circuit comprises a logical AND gate for each word line, said logical AND gate including a first input configured to receive the word line signal, a second input configured to receive a gating control signal derived from said maximum value signal and an output coupled to the word line for the memory cells of the second sub-array.

6. The circuit of claim 1, wherein the word line gating circuit comprises:
a logical AND gate for each word line, said logical AND gate including a first input configured to receive the word line signal, a second input configured to receive a gating control signal and an output coupled to the word line for the memory cells of the second sub-array; and
a latching circuit configured to selectively latch the gating control signal in response to assertion of the maximum value signal.

7. The circuit of claim 6, wherein said latching circuit comprises:
a set-reset latch having a set input configured to receive the maximum value signal and a clock input; and
a further logical AND gate including a first input configured to receive a word line select signal, a second input configured to receive a clocking signal and an output coupled to the clock input of the set-reset latch.

8. The circuit of claim 1, wherein the word line gating circuit comprises:
a logical AND gate for each word line, said logical AND gate including a first input configured to receive the word line signal, a second input configured to receive a gating control signal and an output coupled to the word line for the memory cells of the second sub-array; and
a maximum value address circuit configured in response to assertion of the maximum value signal to store addresses associated with data locations where the mathematical operation performed on the less significant bits of said data word from the first sub-array produces the maximum data value, said maximum value address circuit further configured to output said gating control signal when the memory is addressed at one of the stored addresses.

9. The circuit of claim 8, wherein the memory further comprises input/output circuitry coupled to the memory core, and wherein said input/output circuitry is configured to read the data words for output from only the data location corresponding to the stored address.

10. The circuit of claim 8, wherein the maximum value address circuit is further configured to flag one of the stored addresses whose data word has a highest value, and wherein said input/output circuitry is configured to read the data word for output from only the data location for the stored address that has been flagged.

11. The circuit of claim 1, wherein the memory further comprises:
first input/output circuitry coupled to the first sub-array;
second input/output circuitry coupled to the second sub-array; and
a control circuit configured to generate control signals for controlling operation of circuits within said first input/output circuitry and said second input/output circuitry;
wherein said control circuit comprises a control gating circuit configured to selectively gate passage of the control signals to the second input/output circuitry in response to assertion of said maximum value signal.

12. The circuit of claim 1, wherein said data modification circuit comprises a plurality of adder circuits in series configured to perform the mathematical operation, and wherein the detection circuit is configured to assert the maximum value signal if output from all of the adder circuits is in a same logic state.

13. The circuit of claim 1, wherein the word line gating circuit permits access to all rows of the second sub-array storing more significant bits of said data words in response to assertion of the maximum value signal.

14. The circuit of claim 1, wherein the word line gating circuit permits access to only those certain rows of the second sub-array storing more significant bits of said data words for data locations where the maximum value signal was asserted by the detection circuit due to the mathematical operation performed on the less significant bits from the first sub-array producing the maximum data value.

15. The circuit of claim 1, wherein the memory circuit is further configured to operate in a data read mode of operation to retrieve data words, and wherein the word line gating circuit is further configured to gate passage of a word line signal in the data read mode of operation to access memory cells of the second sub-array.

16. A circuit, comprising:
a memory circuit including:
an array of memory cells arranged to include a first sub-array storing less significant bits of data and a second sub-array storing more significant bits of data;
a first plurality of word lines for the first sub-array;
a second plurality of word lines for the second sub-array; and
a row decoder circuit coupled to the first and second pluralities of word lines, wherein said row decoder generates word line signals and includes a word line gating circuit configured to selectively gate passage of said word line signals to the second plurality of word lines for the second sub-array in response to assertion of a maximum value signal;

a data modification circuit configured to perform a mathematical operation on data read from the array of memory cells; and a detection circuit configured to assert said maximum value signal in response to the mathematical operation performed on the less significant bits of data from the first sub-array producing a maximum data value.

17. The circuit of claim 16, wherein said data modification circuit and detection circuit are external to the memory circuit.

18. The circuit of claim 16, wherein said data modification circuit and detection circuit are internal to the memory circuit.

19. The circuit of claim 16, wherein the mathematical operation is an increment by one operation.

20. The circuit of claim 16, wherein the word line gating circuit comprises a logical AND gate for each word line of said second plurality of word lines, said logical AND gate including a first input configured to receive the word line signal, a second input configured to receive a gating control signal derived from said maximum value signal and an output coupled to the word line of said second plurality of word lines.

21. The circuit of claim 16, wherein the word line gating circuit comprises:
   a logical AND gate for each word line of said second plurality of word lines, said logical AND gate including a first input configured to receive the word line signal, a second input configured to receive a gating control signal and an output coupled to the word line of said second plurality of word lines; and
   a latching circuit configured to selectively latch the gating control signal in response to assertion of the maximum value signal.

22. The circuit of claim 21, wherein said latching circuit comprises:
   a set-reset latch having a set input configured to receive the maximum value signal; and
   a further logical AND gate including a first input configured to receive a word line select signal, a second input configured to receive a clocking signal and an output coupled to a clock set input of the set-reset latch.

23. The circuit of claim 16, wherein the word line gating circuit comprises:
   a logical AND gate for each word line of said second plurality of word lines, said logical AND gate including a first input configured to receive the word line signal, a second input configured to receive a gating control signal and an output coupled to the word line of said second plurality of word lines; and
   a maximum value address circuit configured in response to assertion of the maximum value signal to store addresses associated with data locations where the mathematical operation performed on the less significant bits of said data word from the first sub-array produces the maximum data value, said maximum value address circuit further configured to output said gating control signal when the memory is addressed at one of the stored addresses.

24. The circuit of claim 23, wherein the memory further comprises input/output circuitry coupled to the memory core, and wherein said input/output circuitry is configured to read the data words for output from only the data locations corresponding to the stored addresses.

25. The circuit of claim 23, wherein the maximum value address circuit is further configured to flag one of the stored addresses whose data word has a highest value, and wherein said input/output circuitry is configured to read the data word for output from only the data location for the stored address that has been flagged.

26. The circuit of claim 16, wherein the memory further comprises:
   first input/output circuitry coupled to the first sub-array;
   second input/output circuitry coupled to the second sub-array;
   a control circuit configured to generate control signals for controlling operation of circuits within said first input/output circuitry and said second input/output circuitry;
   wherein said control circuit comprises a control signal gating circuit configured to selectively gate passage of the control signals to the second input/output circuitry in response to assertion of said maximum value.

27. The circuit of claim 16, wherein the memory circuit is further configured to operate in a data read mode of operation to retrieve data words, and wherein the word line gating circuit is further configured to gate passage of a word line signal in the data read mode of operation to access memory cells of the second sub-array.

28. A method for operating a memory circuit that includes an array of memory cells arranged in a modular architecture with a first sub-array configured to store less significant bits of data and a second sub-array configured to store more significant bits of data, the method comprising:
   reading data from the memory circuit;
   performing a mathematical operation on data read from the memory circuit to generate modified data; and
   writing the modified data back to the memory circuit;
   wherein reading data and writing the modified data comprises asserting a word line signal to select a data location in the memory for reading data and writing modified data;
   the method further comprising:
      blocking application of the word line signal to the second sub-array;
      wherein performing the mathematical operation comprises performing the mathematical operation on the less significant bits of the data read from said data location;
      asserting a maximum value signal if the performed mathematical operation on the read less significant bits of the data produces a maximum data value; and
      thereafter permitting application of the word line signal to the second sub-array for at least said data location in response the asserted maximum value signal.

29. The method of claim 28, wherein the mathematical operation is an increment by one operation.

30. The method of claim 28, wherein blocking and thereafter permitting are performed by selectively gating the word line signal.

31. The method of claim 28, further comprising:
   logically combining the maximum value signal with a word line selection signal for said data location to generate a gating control signal; and
   selectively gating said word line signal in response to a logic state of the gating control signal.

32. The method of claim 28, further comprising storing an address applied to the memory to select said data location if the maximum value signal is asserted with respect to the performed mathematical operation on the read less significant bits of the data at that data location.

33. The method of claim 32, further comprising using the stored address to selectively control permitting application of the word line signal to the second sub-array for the data location associated with the stored address.

34. The method of claim 32, further comprising using the stored address to selectively read the modified data from the memory.

35. The method of claim 32, further comprising flagging the stored address if the modified data at the data location associated with the stored address has a highest value.

36. The method of claim 35, further comprising using the stored address that has been flagged to selectively read the modified data with the highest value from the memory.

37. The method of claim 28, wherein the memory further includes first input/output circuitry associated with the first sub-array and second input/output circuitry associated with the second sub-array, the method further comprising:
- applying input/output control signals to the first input/output circuitry, but not the second input/output circuitry, in response to deassertion of the maximum value signal; and
- applying input/output control signals to both the first input/output circuitry and the second input/output circuitry in response to assertion of maximum value signal.

38. The method of claim 28, wherein the memory circuit is further configured to operate in a data read mode of operation to retrieve data words, the method comprising gating application of a word line signal in the data read mode of operation to access memory cells of the second sub-array.

* * * * *